United States Patent
Sakai et al.

(10) Patent No.: US 9,366,731 B2
(45) Date of Patent: Jun. 14, 2016

(54) INTERNAL RESISTANCE MEASUREMENT DEVICE AND METHOD FOR STACKED BATTERY

(75) Inventors: Masanobu Sakai, Yokohama (JP); Tetsuya Kamihara, Yokohama (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 510 days.

(21) Appl. No.: 13/992,397

(22) PCT Filed: Nov. 9, 2011

(86) PCT No.: PCT/JP2011/075792
§ 371 (c)(1),
(2), (4) Date: Jun. 7, 2013

(87) PCT Pub. No.: WO2012/077450
PCT Pub. Date: Jun. 14, 2012

(65) Prior Publication Data
US 2013/0249562 A1    Sep. 26, 2013

(30) Foreign Application Priority Data

Dec. 10, 2010    (JP) ................................. 2010-275638

(51) Int. Cl.
| | | |
|---|---|---|
| G01N 27/416 | (2006.01) | |
| G01R 31/36 | (2006.01) | |
| H01M 8/04 | (2016.01) | |
| H01M 10/48 | (2006.01) | |
| H01M 10/04 | (2006.01) | |

(52) U.S. Cl.
CPC ........ *G01R 31/3662* (2013.01); *H01M 8/04634* (2013.01); *H01M 8/04641* (2013.01); *H01M 8/04649* (2013.01); *H01M 10/48* (2013.01); *H01M 10/482* (2013.01); *H01M 10/0413* (2013.01); *Y02E 60/50* (2013.01)

(58) Field of Classification Search
CPC .................................................. H01M 8/04634
USPC ........................................................... 324/430
See application file for complete search history.

(56) References Cited

FOREIGN PATENT DOCUMENTS

| JP | 03-226688 A | 10/1991 |
|---|---|---|
| JP | 3003659 U | 8/1994 |
| JP | 2003-014829 A | 1/2003 |
| JP | 2008-547008 A | 12/2008 |
| JP | 2009-109375 A | 5/2009 |
| JP | 4360052 B2 | 11/2009 |
| JP | 2010-078556 A | 4/2010 |

*Primary Examiner* — Edward Tso
*Assistant Examiner* — Ahmed Omar
(74) *Attorney, Agent, or Firm* — Foley & Lardner LLP

(57) ABSTRACT

An internal resistance measurement device for stacked battery includes an AC power supply part for outputting an AC current to an measurement-object, which includes at least a stacked battery made of a plurality of stacked power generating elements, by being connected to the measurement-object, an AC adjusting part for adjusting an AC current so that a positive-electrode AC potential difference, which is a potential difference obtained by subtracting potential in a middle portion from potential in a portion connected to a load device on the positive side of the measurement-object, matches a negative-electrode AC potential difference, which is a potential difference obtained by subtracting potential in the middle portion from potential in a portion connected to the load device on the negative side of the measurement-object, and a resistance calculating part for calculating resistance of the battery based on the adjusted AC current and the AC potential difference.

16 Claims, 21 Drawing Sheets

INTERNAL RESISTANCE MEASUREMENT DEVICE AND METHOD FOR STACKED BATTERY

TECHNICAL FIELD

The present disclosure relates to a device and a method for measuring internal resistance of a stacked battery in which a plurality of power generating elements is stacked.

BACKGROUND ART

In a stacked battery in which a plurality of power generating elements is stacked, it is desirable to detect internal resistance as accurate as possible. For example, in a fuel-cell, wettability of an electrolyte membrane can be determined by understanding internal resistance. High internal resistance is associated with low wettability of an electrolyte membrane with a tendency to dry out. Low internal resistance is associated with high wettability of an electrolyte membrane. Operating efficiency of the fuel-cell is variable depending on wettability of an electrolyte membrane. Therefore, an optimal wet state of an electrolyte membrane can be constantly maintained by controlling operation in accordance with wettability of the electrolyte membrane as estimated based on internal resistance.

A device for measuring internal resistance of a fuel-cell is disclosed in JP-2009-109375-A.

SUMMARY

However, the device according to JP-2009-109375-A requires a load current (DC) flowing from the cell during measurement so that measurement is not possible unless the cell is under operation. Moreover, even a minute AC current is controlled (or current supply is limited) by an electronic load apparatus which controls a large DC current, wherein an extremely wide dynamic range is required. Therefore, components and circuit specification to be used are costly.

The present disclosure was achieved by focusing attention on such conventional problems. The present disclosure aims at providing an inexpensive internal resistance measurement device and an inexpensive internal resistance measurement method capable of measuring internal resistance even when a battery is not under operation.

An internal resistance measurement device for stacked battery according to an embodiment of the present invention includes an AC power supply part which outputs an AC current to an internal resistance measurement object comprising a stacked battery containing a plurality of stacked power generating elements by being connected to the internal resistance measurement object. Then, the internal resistance measurement device further includes a positive portion connected to a positive electrode of the internal resistance measurement object, a negative portion connected to a negative electrode of the internal resistance measurement object, a middle portion connected to a middle part of the internal resistance measurement object, an AC adjusting part for adjusting an AC current output to the positive electrode and the negative electrode of the internal resistance measurement object, and a resistance calculating part for calculating resistance of the stacked battery based on the adjusted AC current and the AC potential difference.

Embodiments of the present invention and advantages of the present invention will be explained below in detail along with accompanying drawings.

EMBODIMENTS

First Embodiment

Figure 1A:
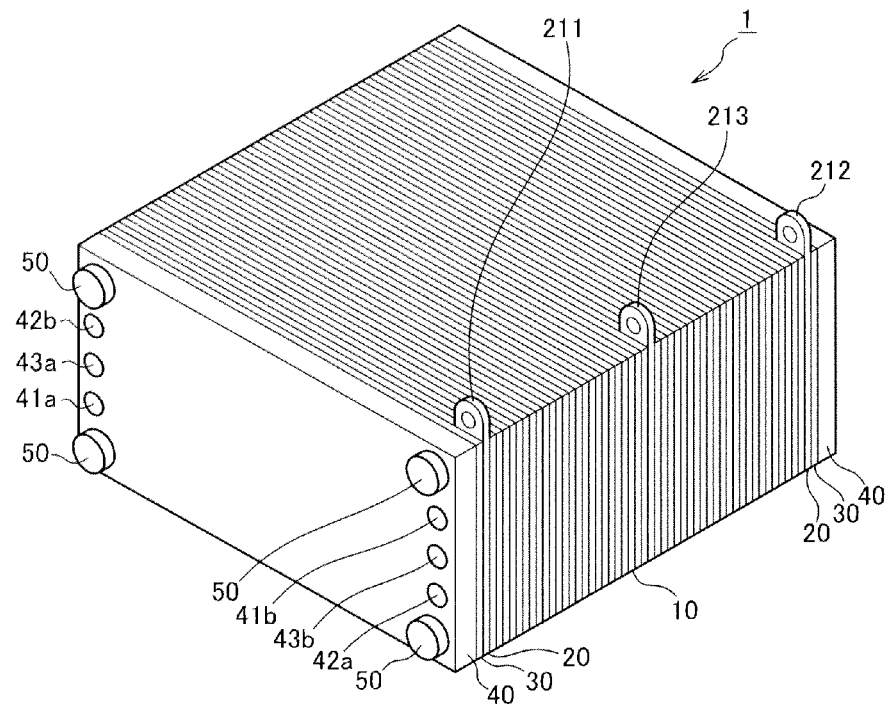
FIG. 1A is an external perspective view to explain a fuel-cell serving as an example of a stacked battery to which an internal resistance measurement device according to the present invention is applied.
Figure 1B:
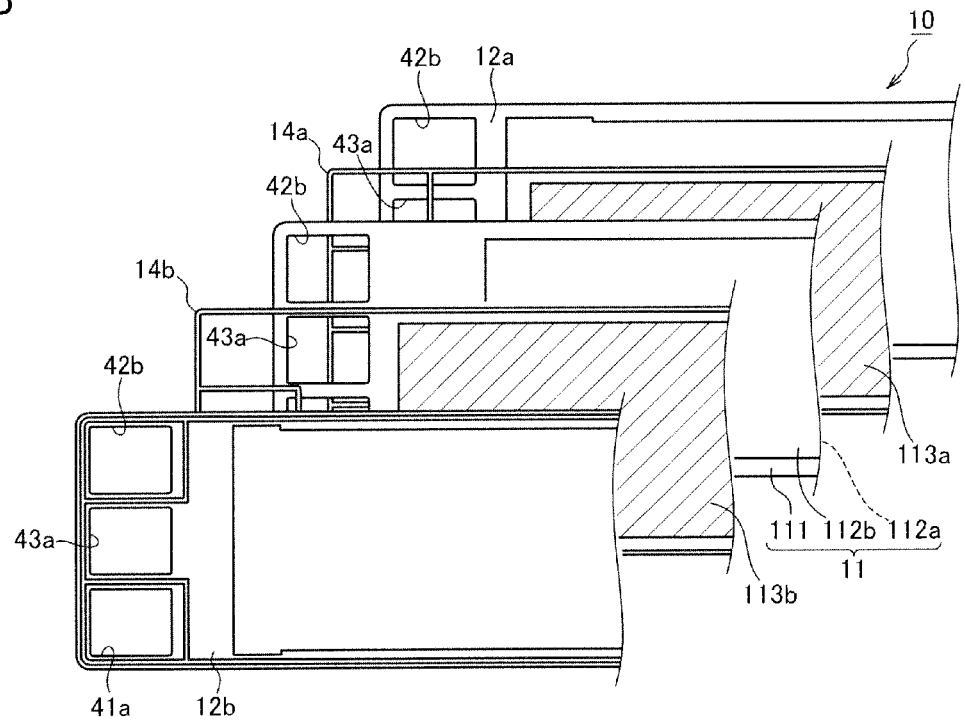
FIG. 1B is an exploded view showing a structure of power generation cells of the fuel-cell serving as an example of the stacked battery to which the internal resistance measurement device according to the present invention is applied.

FIG. 1A is an external perspective view to explain a fuel-cell as an example of a stacked battery to which an internal resistance measurement device according to the present invention is applied. FIG. 1B is an exploded view to explain power generation cells of the fuel-cell serving as an example of the stacked battery to which the internal resistance measurement device according to the present invention is applied.

As shown in FIG. 1A, a fuel-cell stack 1 is provided with a plurality of stacked power generation cells 10, current collecting plates 20, insulating plates 30, end plates 40 and four tension rods 50.

The power generation cells 10 are unit cells of the fuel-cell. Each of the power generation cells 10 generates an electromotive voltage of about 1 volt. A detailed structure of each of the power generation cells 10 will be explained later.

The current collecting plates 20 are arranged at the outer side of the plurality of stacked power generation cells 10. The current collecting plates 20 are formed by a gas impermeable conductive member such as, for example, compact carbon. The current collecting plates 20 include a positive electrode terminal 211 and a negative electrode terminal 212. There is also a middle terminal 213 provided between the positive electrode terminal 211 and the negative electrode terminal 212. In the fuel-cell stack 1, an electron e⁻ generated in each of the power generation cells 10 is extracted and outputted by the positive electrode terminal 211 and the negative electrode terminal 212.

The insulating plates 30 are arranged at the outer side of the current collecting plates 20. The insulating plates 30 are formed by an insulating member such as, for example, rubber.

The end plates 40 are arranged at the outer side of the insulating plates 30. The end plates 40 are formed by a rigid metal material such as, for example, steel.

Arranged on one of the end plates 40 (i.e. end plate 40 on the left side facing front in FIG. 1A) are an anode supply port 41a, an anode discharge port 41b, a cathode supply port 42a, a cathode discharge port 42b, a cooling water supply port 43a, and a cooling water discharge port 43b. In the present embodiment, the anode discharge port 41b, the cooling water discharge port 43b and the cathode supply port 42a are arranged on the right side in FIG. 1A. The cathode discharge port 42b, the cooling water supply port 43a and the anode supply port 41a are also arranged on the left side in FIG. 1A.

The tension rods 50 are arranged in the vicinity of four corners of the end plate 40. The fuel-cell stack 1 is formed with holes (not shown) penetrating through the inside thereof. The tension rods 50 are inserted into the through holes. The tension rods 50 are formed by a rigid metal material such as, for example, steel. Insulation treatment is applied to the surface of the tension rods 50 so as to prevent an electric short circuit among the power generation cells 10. The tension rods 50 are screwed with nuts (not shown because of being located inside). The fuel-cell stack 1 is squeezed to a stacking direction by the tension rods 50 and the nuts.

Examples of a method to supply hydrogen serving as an anode gas to the anode supply port 41a include a method to directly supply a hydrogen gas from a hydrogen storage device and a method to supply a hydrogen-containing gas reformed by reforming a hydrogen-containing fuel. Note that the hydrogen storage device is realized by a high pressure gas tank, liquefied hydrogen tank and hydrogen storage alloy tank or other tanks. The hydrogen-containing fuel includes a natural gas, methanol, gasoline and the like. Air is also used in general as a cathode gas supplied to the cathode supply port 42a.

As shown in FIG. 1B, each of the power generation cells 10 is structured by arranging an anode separator (or anode bipolar plate) 12a and a cathode separator (or cathode bipolar plate) 12b on both surfaces of an MEA (membrane electrode assembly) 11.

The MEA 11 is provided with electrode catalyst layers 112 on both sides of an electrolyte membrane 111 made of an ion exchange membrane. GDL (gas diffusion layer) 113 is formed on each of the electrode catalyst layers 112.

The electrode catalyst layers 112 are formed by, for example, carbon black particles carrying platinum.

The GDLs 113 are formed by a member with sufficient gas diffusibility and conductivity such as, for example, carbon fibers.

An anode gas supplied from the anode supply port 41a flows through the GDL 113a and reacts to the anode electrode catalyst layer 112 (i.e. 112a), followed by being discharged from the anode discharge port 41b.

A cathode gas supplied from the cathode supply port 42a flows through the GDL 113b and reacts to the cathode electrode catalyst layer 112 (i.e. 112b), followed by being discharged from the cathode discharge port 42b.

The anode separator 12a is stacked on one side of the MEA 11 (i.e. rear side thereof in FIG. 1B) via the GDL 113a and a seal 14a. The cathode separator 12b is stacked on one side of the MEA 11 (i.e. front side thereof in FIG. 1B) via the GDL 113b and a seal 14b. The seals 14 (i.e. 14a and 14b) are made of a rubber elastic material such as, for example, silicone rubber, EPDM (ethylene propylene diene monomer) and fluororubber. Each of the anode separator 12a and the cathode separator 12b is formed by press molding of a separator substrate made of metal such as, for example, stainless metal and including a reactant gas flow path formed on one side thereof and a cooling water flow path formed on the opposite side thereof so as to run parallel with the reaction gas flow path. As shown in FIG. 1B, the anode separator 12a and the cathode separator 12b are stacked on one another to form a cooling water flow path.

Each of the MEA 11, the anode separator 12a and the cathode separator 12b is formed with the holes 41a, 41b, 42a, 42b, 43a and 43b and these holes are stacked on one another to form the anode supply port (or anode supply manifold) 41a, the anode discharge port (anode discharge manifold) 41b, the cathode supply port (cathode supply manifold) 42a, the cathode discharge port (or cathode discharge manifold) 42b, the cooling water supply port (or cooling water supply manifold) 43a and the cooling water discharge port (or cooling water discharge manifold) 43b.

Figure 2:
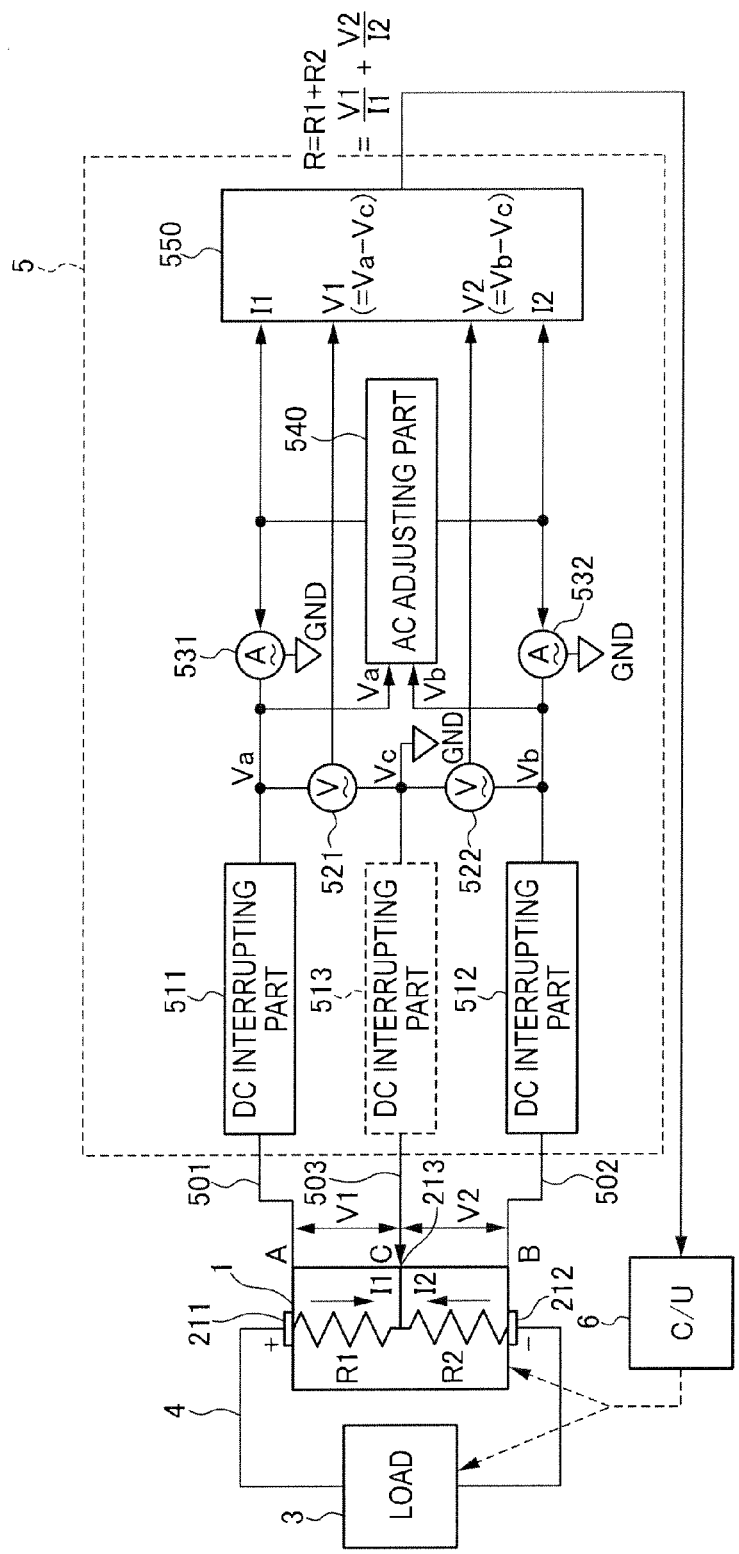
FIG. 2 is a circuit diagram showing an internal resistance measurement device for stacked battery according to a first embodiment of the present invention.

FIG. 2 is a circuit diagram showing an internal resistance measurement device for stacked battery according to a first embodiment of the present invention.

An internal resistance measurement device 5 includes a positive electrode DC interrupting part 511, a negative electrode DC interrupting part 512, a midpoint DC interrupting part 513, a positive electrode AC potential difference detecting part 521, a negative electrode AC potential difference detecting part 522, a positive electrode power supply part 531, a negative electrode power supply part 532, an AC adjusting part 540 and a resistance calculating part 550.

Figure 3:
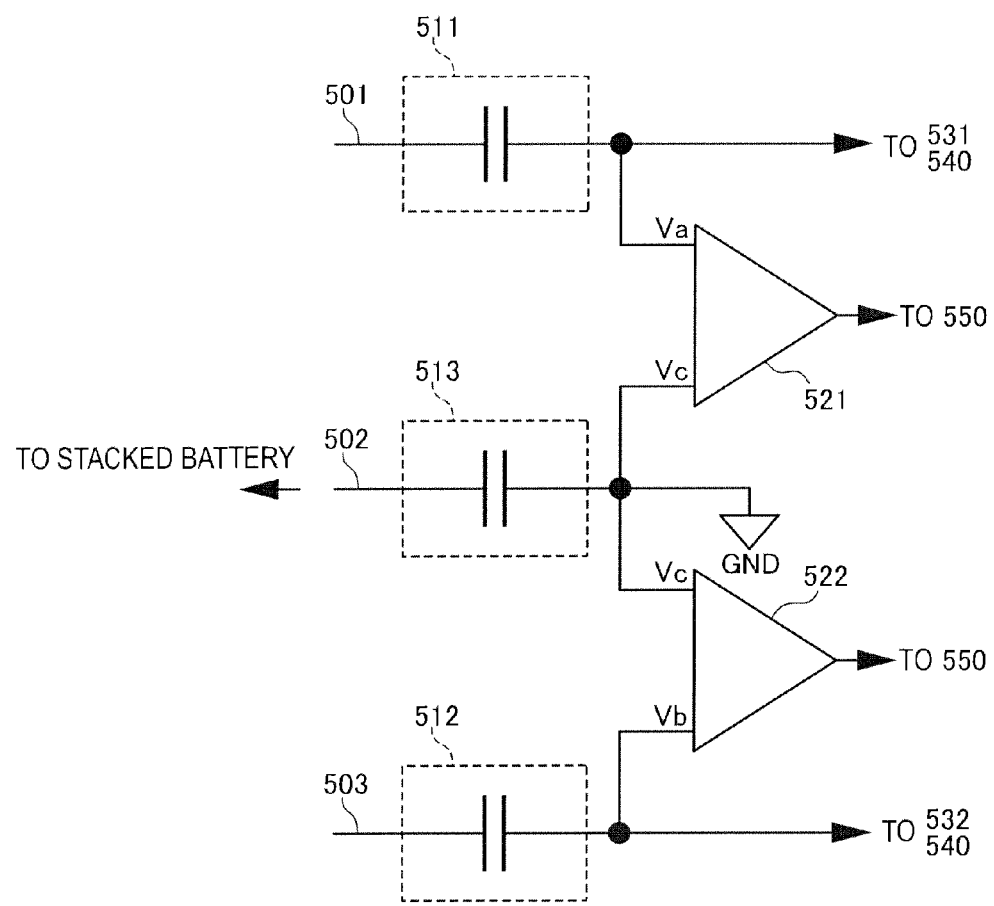
FIG. 3 is a view to explain details of a positive electrode DC interrupting part 511, a negative electrode DC interrupting part 512, a midpoint DC interrupting part 513, a positive electrode AC potential difference detecting part 521 and a negative electrode AC potential difference detecting part 522.

Details of the positive electrode DC interrupting part 511, the negative electrode DC interrupting part 512, the midpoint DC interrupting part 513, the positive electrode AC potential difference detecting part 521, and the negative electrode AC potential difference detecting part 522 will be explained with reference to FIG. 3.

The fuel-cell 1 is the internal resistance measurement object. The positive electrode DC interrupting part 511 is connected to a positive electrode terminal 211 of the fuel-cell 1. Moreover, the positive electrode terminal 211 is connected to a positive electrode of a load device 3 via connection line 4. The negative electrode DC interrupting part 512 is connected to a negative electrode terminal 212 of the fuel-cell 1. Moreover, the negative electrode terminal 212 is connected to a negative electrode of a load device 3 via connection line 4. The midpoint DC interrupting part 513 is connected to a middle terminal 213 of the fuel-cell 1. Note that the midpoint DC interrupting part 513 may not be provided as shown by a broken line in FIG. 2. These DC interrupting parts interrupt DC but allow AC to flow. The DC interrupting parts are realized by, for example, capacitors and transformers.

The positive electrode AC potential difference detecting part 521 outputs an AC potential difference by receiving AC potential Va in the positive electrode terminal 211 of the fuel-cell 1 and AC potential Vc in the middle terminal 213 thereof. The negative electrode AC potential difference detecting part 522 outputs an AC potential difference by receiving AC potential Vb in the negative terminal 212 of the fuel-cell 1 and the AC potential Vc from in the middle terminal 213 thereof. The positive electrode AC potential difference detecting part 521 and the negative electrode AC potential difference detecting part 522 are realized by, for example, differential amplifiers (or instrumentation amplifiers).

Details of the positive electrode power supply part 531 and the negative electrode power supply part 532 will be explained with reference to FIG. 4.

Figure 4:
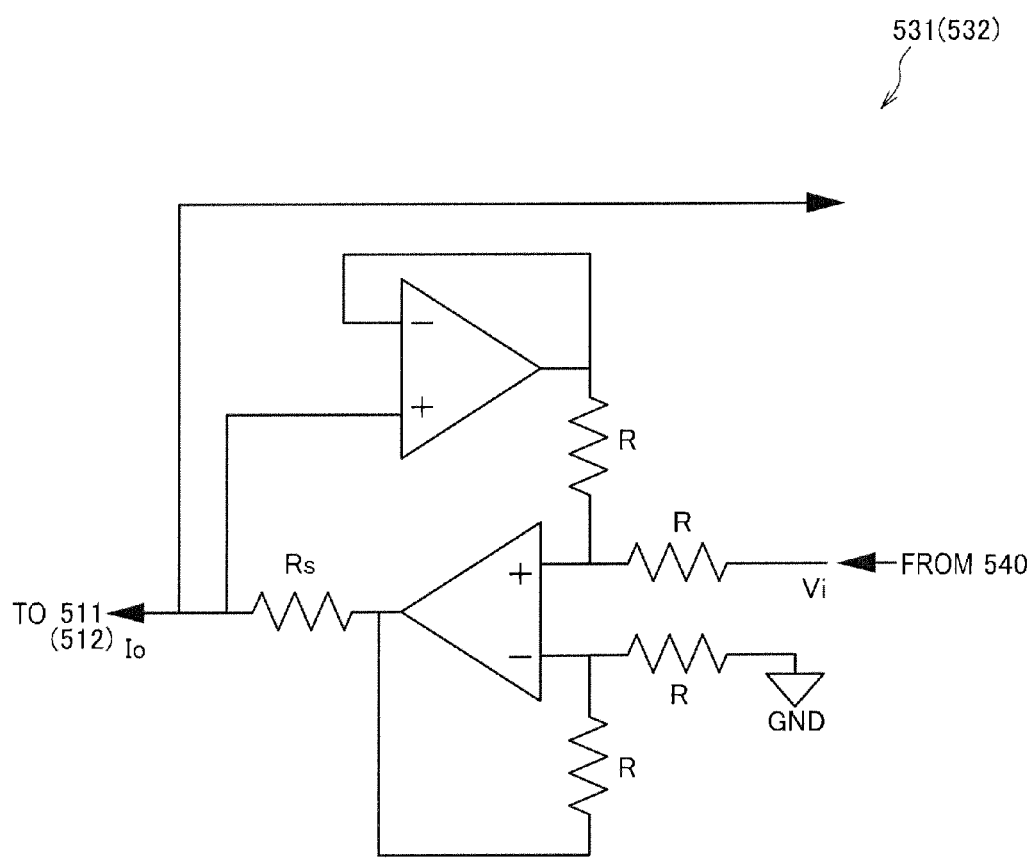
FIG. 4 is a view to explain details of a positive electrode power supply part 531 and a negative electrode power supply part 532.

The positive electrode power supply part 531 can be realized by, for example, a voltage/current conversion circuit made of operational amplifiers (OP amplifiers) as shown in FIG. 4. According to this circuit, a current Io which is proportional to an input voltage Vi is outputted. Note that Io is obtained by dividing Vi by Rs which is a current sensing resistor. That is, this circuit is a variable AC current source which is capable of adjusting the output current To by the input voltage Vi.

It is possible with the use of this circuit to obtain the output current Io by dividing the input voltage Vi by the proportionality factor Rs without actual measurement of the output current Io. Moreover, even if an element which generates a different phase angle such as a capacitor is interposed in a current path, an AC current flowing through the stacked cell groups is brought into the same phase as an output of the current source because a current is outputted. Furthermore, the current is also brought into the same phase as the input voltage Vi. Accordingly, the circuit is simplified with no necessity of considering a phase difference in resistance calculation in a next stage. In addition, even if a capacitor arranged in the current path has variable impedance, it is not affected by a phase change. Due to these reasons, the circuit as shown in FIG. 4 is preferably used as the positive electrode power supply part 531. The same shall apply to the negative electrode power supply part 532.

Details of the AC adjusting part 540 will be explained with reference to FIG. 5.

Figure 5:
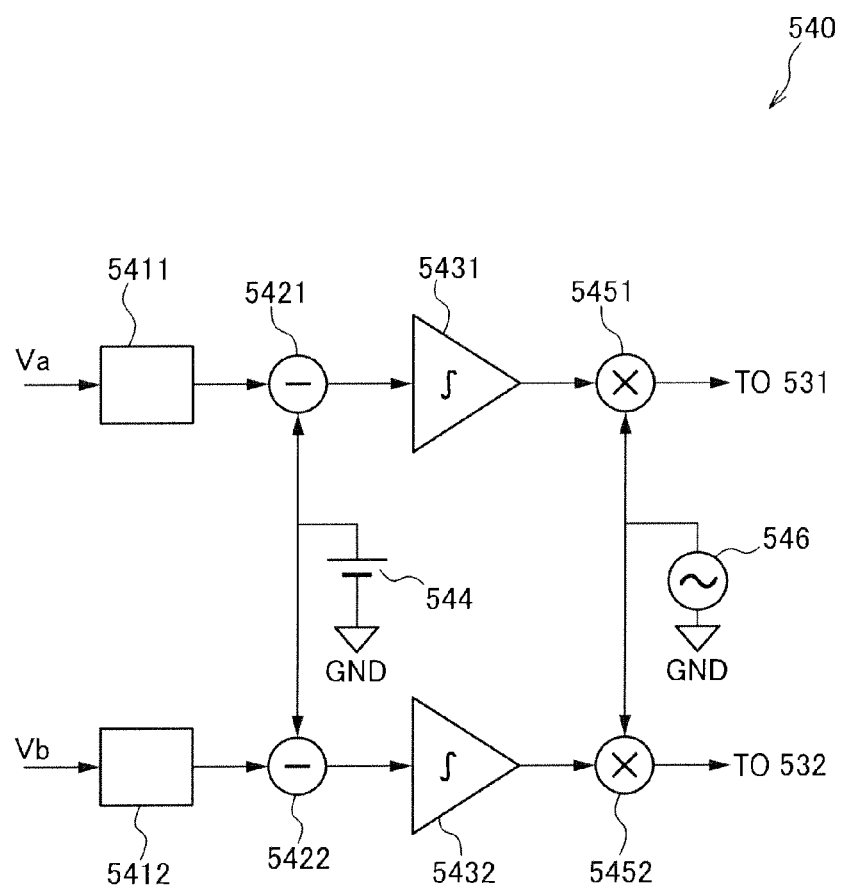
FIG. 5 is a view to explain details of an AC adjusting part 540.

The AC adjusting part 540 can be realized by, for example, a PI control circuit as shown in FIG. 5. The AC adjusting part 540 includes a positive electrode detector circuit 5411, a positive electrode subtracter 5421, a positive electrode integration circuit 5431, a positive electrode multiplier 5451, a negative electrode detector circuit 5412, a negative electrode subtracter 5422, a negative electrode integration circuit 5432, a negative electrode multiplier 5452, a reference voltage 544 and an AC signal source 546.

The positive electrode detector circuit 5411 removes an unnecessary signal from the AC potential Va on a wiring of the positive electrode power supply part 531 connected to the positive electrode terminal 211 of the stacked battery 1, and converts it into a DC signal.

The positive electrode subtracter 5421 detects a difference between the DC signal and the reference voltage 544. The positive electrode integration circuit 5431 equalizes a signal outputted from the positive electrode subtracter 5421 or adjusts sensitivity of the signal.

The positive electrode multiplier 5451 modulates amplitude of the AC signal source 546 by an output of the positive electrode integration circuit 5431.

The AC adjusting part 540 thus generates a command signal sent to the positive electrode power supply part 531. The AC adjusting part 540 also generates a command signal sent to the negative electrode power supply part 532 in the same manner. In accordance with thus generated command signals, outputs of the positive electrode power supply part 531 and the negative electrode power supply part 532 are increased/decreased to control both of the AC potential Va and Vb to a predetermined level. Therefore, each of the AC potential Va and Vb becomes equipotential.

Note that the circuit configuration shown in this example by using an analog arithmetic integrated circuit as an example may also be composed of a digital control circuit after digital conversion of the AC potential Va (or Vb) by an AD converter.

Figure 6:
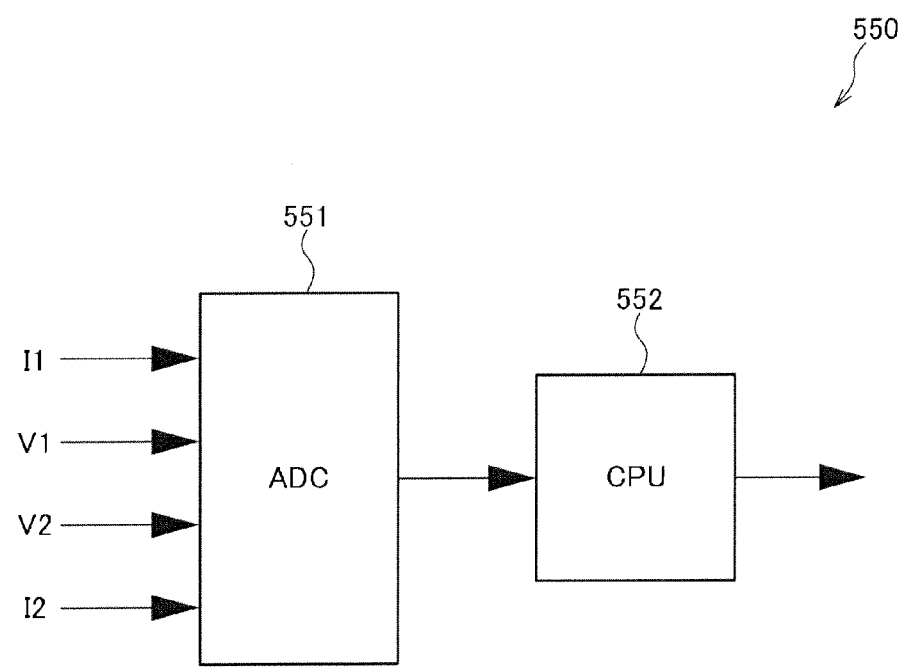
FIG. 6 is a view to explain details of a resistance calculating part 550.

Details of the resistance calculating part 550 will be explained with reference to FIG. 6.

The resistance calculating part 550 includes an AD converter 551 and a micro computer chip 552.

The AD converter 551 converts AC currents (I1, I2) and AC voltages (V1, V2), each of which is an analog signal, into digital numerical value signals to be transferred to the microcomputer chip 552.

The microcomputer chip 552 pre-stores programs to calculate internal resistance Rn and whole internal resistance R of the stacked battery. The microcomputer chip 552 performs sequential operations at predetermined micro time intervals or outputs operation results in response to a request of a controller 6. Note that the internal resistance Rn and the whole internal resistance R of the stacked battery are calculated by the following formulae.

[formula 1.]

Arithmetic expression for resistance (1-1)

$$Rn = \frac{Vn}{In}(n = 1, 2, \ldots, n)$$

Whole resistance value (1-2)

$$R = \sum Rn$$

The resistance calculating part 550 may also be realized by an analog arithmetic circuit using an analog arithmetic integrated circuit. According to an analog arithmetic circuit, continuous resistance value changes in terms of time can be outputted.

Figure 7:
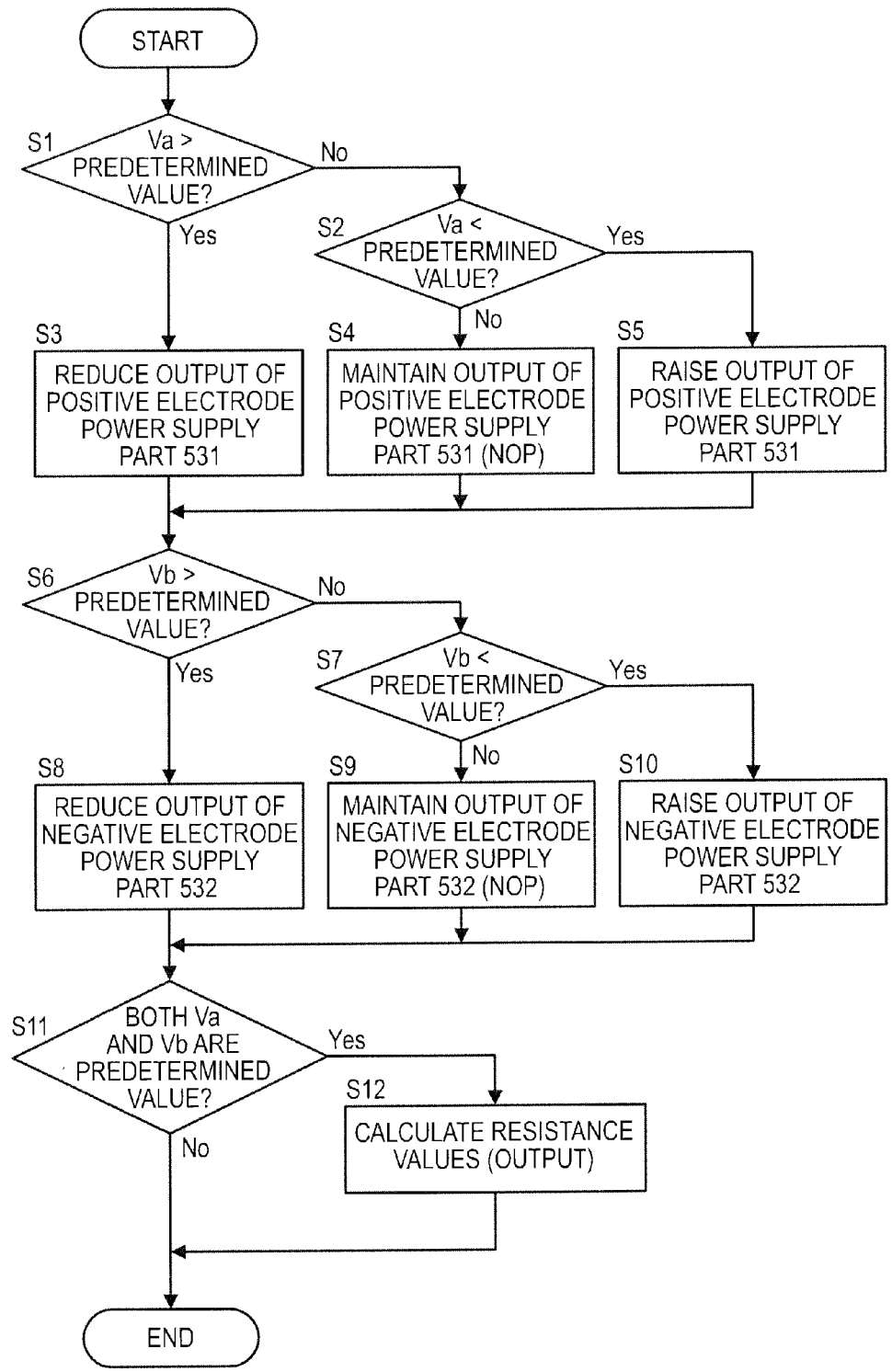
FIG. 7 is a control flowchart to be executed by a controller in the internal resistance measurement device for stacked battery according to the first embodiment of the present invention.

FIG. 7 is a control flowchart to be executed by the controller in the internal resistance measurement device for stacked battery according to the first embodiment of the present invention.

In step S1, the controller determines whether or not the positive electrode AC potential Va is larger than a predetermined value. The controller allows the process to move onto step S2 when the determination result is negative or allows the process to move onto step S3 when the determination result is positive.

In step S2, the controller determines whether or not the positive electrode AC potential Va is less than a predetermined value. The controller allows the process to move onto step S4 when the determination result is negative or allows the process to move onto step S5 when the determination result is positive.

In step S3, the controller causes the positive electrode power supply part 531 to reduce an output. Therefore, the positive electrode AC potential Va decreases.

In step S4, the controller causes the positive electrode power supply part 531 to maintain an output. Therefore, the positive electrode AC potential Va is maintained.

In step S5, the controller causes the positive electrode power supply part 531 to increase an output. Therefore, the positive electrode AC potential Va rises.

In step S6, the controller determines whether or not the negative electrode AC potential Vb is larger than a predetermined value. The controller allows the process to move onto step S7 when the determination result is negative or allows the process to move onto step S8 when the determination result is positive.

In step S7, the controller determines whether or not the negative electrode AC potential Vb is less than a predetermined value. The controller allows the process to move onto step S9 when the determination result is negative or allows the process to move onto step S10 when the determination result is positive.

In step S8, the controller causes the negative electrode power supply part 532 to reduce an output. Therefore, the negative electrode AC potential Vb decreases.

In step S9, the controller allows the negative electrode power supply part 532 to maintain an output. Therefore, the negative electrode AC potential Vb is maintained.

In step S10, the controller causes the negative electrode power supply part 532 to increase an output. Therefore, the negative electrode AC potential Vb rises.

In step S11, the controller determines whether or not the positive electrode AC potential Va and the negative electrode AC potential Vb are a predetermined value. The controller allows the process to move onto step S12 when the determination result is positive or exits from the process when the determination result is negative.

In step S12, the controller calculates resistance values based on the above formulae (1-1) and (1-2).

Figure 8:
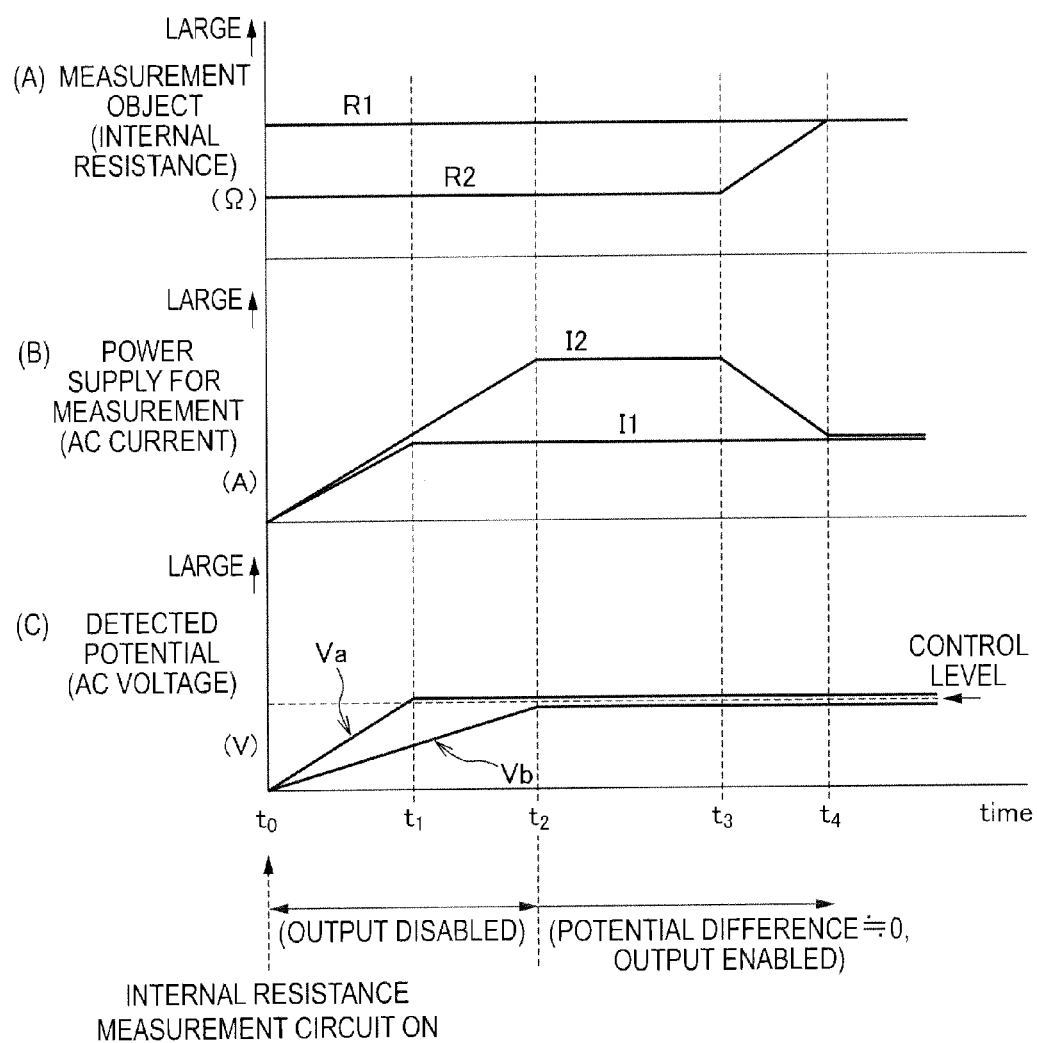
FIG. 8 is a time chart obtained when a control is made by the controller in the internal resistance measurement device for stacked battery according to the present invention.

FIG. 8 is a time chart obtained when the controller executes a control in the internal resistance measurement device for stacked battery according to the present invention.

Note that it will be shown along with step number for easy understanding corresponding to the flowchart.

At an early stage in FIG. 8, an internal resistance value R1 on the positive electrode side is high and an internal resistance value R2 on the negative electrode side is low (see FIG. 8A). The controller starts control under such a condition.

At time t0, neither the positive electrode AC potential Va nor the negative electrode AC potential Vb reaches a control level (see FIG. 8C). Under this condition, the controller repeats processing the steps S1→S2→S5→S6→S7→S10→S11. Therefore, the positive electrode AC current I1 and the negative electrode AC current I2 increase (see FIG. 8B).

When the positive electrode AC potential Va reaches the control level at time t1 (see FIG. 8C), the controller repeats processing the steps S→S2→S4→S6→S7→S10→S11. Therefore, the positive electrode AC current I1 is maintained and the negative electrode AC current I2 increases (see FIG. 8B).

When the negative electrode AC potential Vb also reaches the control level to be the same as the positive electrode AC potential Va at time t2 (see FIG. 8C), the controller processes the steps S1→S2→S4→S6→S7→S9→S11→S12. Therefore, the positive electrode AC current I1 and the negative electrode AC current I2 are maintained. Then, based on the formula (1-1), the positive electrode internal resistance value R1 and the negative electrode internal resistance value R2 are calculated. Then, the positive electrode internal resistance value R1 and the negative electrode internal resistance value R2 are combined to obtain the whole internal resistance R.

At time t3 and thereafter, the negative electrode internal resistance value R2 is on the rise due to a wet state change of the fuel-cell or other factors (see FIG. 8A). In this case, the controller repeats processing the steps S1→S2→S4→S6→S8→S11→S12. Owing to such a process, the negative electrode AC current I2 decreases in accordance with the rise of the negative electrode internal resistance value R2, whereby the negative electrode AC potential is maintained to be in the same level as the positive electrode AC potential. Accordingly, the internal resistance can be calculated even in this state.

At time t4 and thereafter, the negative electrode internal resistance value matches the positive electrode internal resistance value (see FIG. 8A). In this case, the controller repeats the steps S1→S2→S4→S6→S7→S9→S11→S12. Owing to such processing, the positive electrode AC potential is maintained to be in the same level as the negative electrode AC potential (see FIG. 8C) and internal resistance is calculated.

Figure 9:
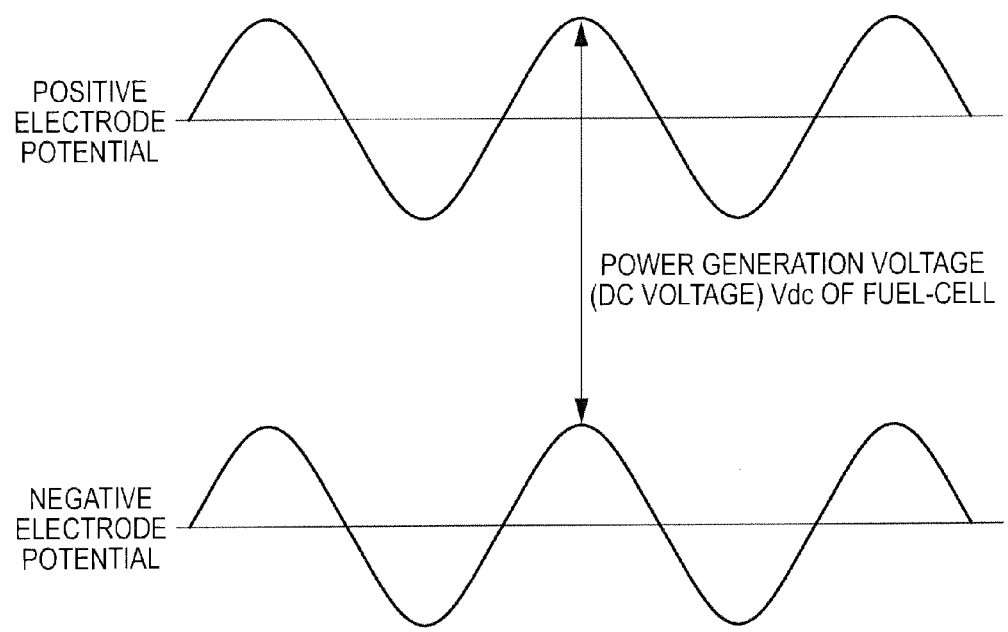
FIG. 9 is a view to explain an action effect of the first embodiment.

FIG. 9 is a diagram to explain an action effect of the first embodiment.

During an output of the stacked battery (i.e. fuel-cell), there is a potential difference between the positive electrode and the negative electrode (i.e. DC potential difference Vdc). Then, in the present embodiment, AC currents are outputted from the positive electrode power supply part 531 and the negative electrode power supply part 532 in response to a command of the AC adjusting part 540.

AC current outputted from the positive electrode power supply part 531 is outputted to the positive electrode of the stacked battery (i.e. fuel-cell) via the positive electrode DC interrupting part 511 and flows to the positive electrode AC potential difference detecting part 521 via the middle terminal 213 and the midpoint DC interrupting part 513. At this time, the AC potential difference V1 (V1=Va−Vc) occurs corresponding to internal resistance and a supplied current. The AC potential difference V1 is detected by the positive electrode AC potential difference detecting part 521.

AC current outputted from the negative electrode power supply part 532 is outputted to the negative electrode of the stacked battery (or fuel-cell) via the negative electrode DC interrupting part 512 and flows to the negative electrode AC potential difference detecting part 522 via the middle terminal 213 and the midpoint DC interrupting part 513. At this time, the AC potential difference V2 (V2=Vb−Vc) occurs corresponding to internal resistance and a supplied current. The AC potential difference V2 is detected by the negative electrode AC potential difference detecting part 522.

The AC adjusting part 540 adjusts the positive electrode power supply part 531 and the negative electrode power supply part 532 so as to constantly make the difference between the positive electrode AC potential difference V1 and the negative electrode AC potential difference V2 (V1−V2, equal to Va−Vb) small in the stacked battery (i.e. fuel-cell).

Note that AC components are superimposed on DC potential of the positive electrode and the negative electrode during an output of the stacked battery (i.e. fuel-cell) as shown in FIG. 9, wherein the AC components are adjusted to remain the same by the AC adjusting part 540 and therefore the DC potential difference Vdc is constant without fluctuations.

Then, the Ohm's law is applied in the resistance calculating part 550 to the output V1 of the positive electrode AC potential difference detecting part 521, the output V2 of the negative electrode AC potential difference detecting part 522, the AC current I1 of the positive electrode power supply part 531 and the AC current I2 of the negative electrode power supply part 532 in order to calculate the internal resistance R1 on the positive electrode side and the internal resistance R2 on the negative electrode side in the fuel-cell 1.

Thus, the positive electrode terminal 211 and the negative electrode terminal 212 share the same AC potential according to the present embodiment. Therefore, even if a load device (such as traction motor) is connected to the positive electrode terminal 211 and the negative electrode terminal 212, leakage of an AC current to the load device can be suppressed.

As a result, the value of AC currents flowing through the internal resistance measurement object (i.e. fuel-cell) matches the value of AC currents outputted from the power supply parts and therefore AC currents flowing to the measurement object can be detected accurately. Since the positive electrode internal resistance value R1 and the negative electrode internal resistance value R2 in the stacked battery are obtained based on the AC currents, the positive electrode internal resistance value R1 and the negative electrode internal resistance value R2 in the stacked battery under operation can be measured accurately without being affected by a condition of the load device, whereby further enabling accurate measurement of the whole internal resistance value R of the stacked battery.

In addition, owing to the power supply parts used in the present embodiment, internal resistance can be measured even when the stacked battery (i.e. fuel-cell) is suspended.

Second Embodiment

Figure 10A:
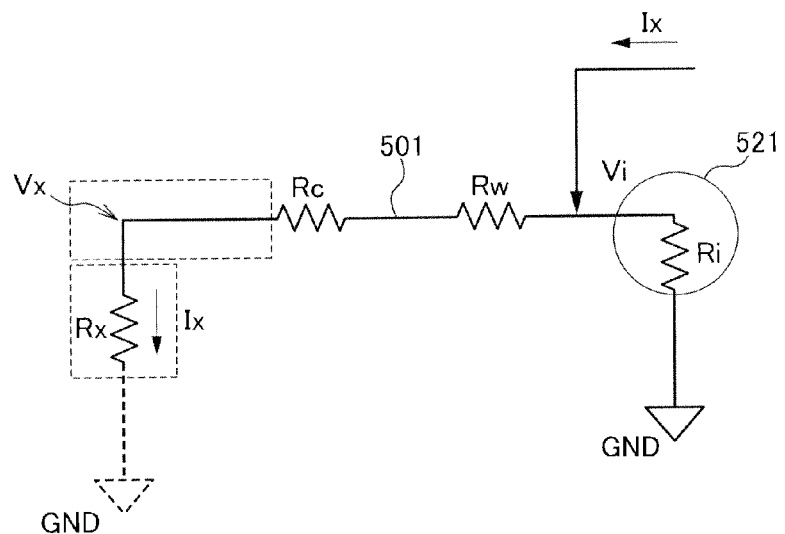
FIG. 10A is a view to explain a mechanism of an action effect of an internal resistance measurement device for stacked battery according to a second embodiment of the present invention.
Figure 10B:
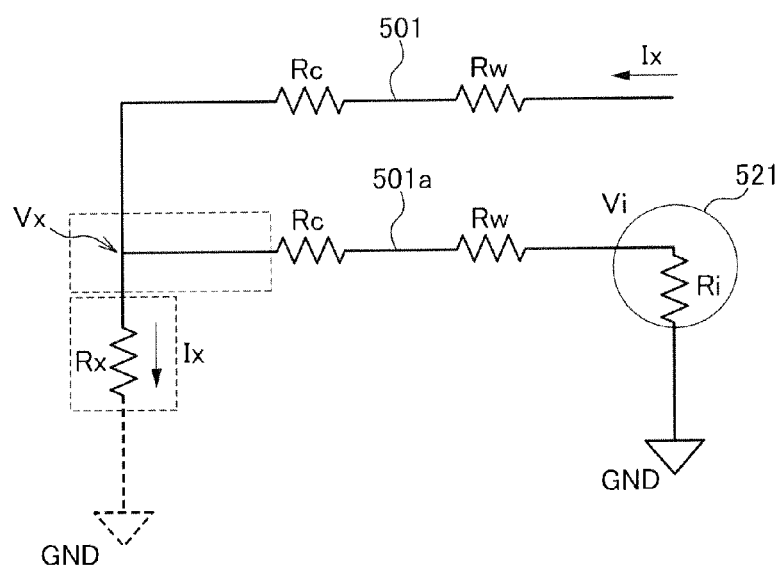
FIG. 10B is a view to explain a mechanism of an action effect of the internal resistance measurement device for stacked battery according to the second embodiment of the present invention.

FIG. 10A and FIG. 10B are diagrams to explain a mechanism of an action effect of an internal resistance measurement device for stacked battery according to a second embodiment of the present invention.

Although each of the AC potential difference detecting parts 521 and 522 and each of the power supply parts 531 and 532 are connected to the fuel-cell 1 by using one route in the first embodiment, they are connected to the fuel-cell 1 by different routes in the present embodiment. This connection will improve detection accuracy of internal resistance. The reason will be explained below.

When the AC potential difference detecting part and the power supply part are connected by one route as shown in FIG. 10A, potential Vx of the fuel-cell 1 is expressed by the following formula.

[formula 2.]

$$Vx = Rx \times Ix \quad (2)$$

Meanwhile, a voltage Vi detected by the AC potential difference detecting part 521 is expressed by the following formula.

[formula 3.]

$$Vi = Vx + (Rc + Rw) \times Ix \quad (3)$$

Thus, the voltage Vi detected by the AC potential difference detecting part 521 is obtained by adding wiring resistance Rw, contact resistance Rc in a connection point, and an error voltage corresponding to an AC current to the potential Vx whose detection is originally desired. Accordingly, a measurement error err is expressed by the following formula.

[formula 4.]

$$err = \frac{Vi}{Vx} = \frac{Rx + Rc + Rw}{Rx} \quad (4)$$

Since measurement object resistance Rx is large in small batteries or the like in general, the contact resistance Rc and the wiring resistance Rw can be ignored and cause no problem in practical use, whereas large batteries are generally associated with a relationship such that the wiring resistance Rw is larger than the measurement object resistance Rx. In this case, each of the stacked cell groups needs to be connected by the four-terminal method.

Therefore, the present embodiment involves connection of each of the AC potential difference detecting parts and each of the power sources by a separate route as shown in FIG. 10B. In such a configuration, the contact resistance Rc and the wiring resistance Rw on a AC voltage detecting line 501a act to divide the voltage Vx whose detection is desired by input resistance Ri of the AC potential difference detecting part 521. In general, the input resistance Ri of the AC potential difference detecting part 521 is extremely large in comparison with the wiring resistance Rw and the contact resistance Rc (Ri>>(Rw+Rc)). Accordingly, in such a configuration, the measurement error err can be expressed by the following formula and shall be negligibly minimal, wherein Vi can be regarded as Vx.

[formula 5.]

$$err = \frac{Vi}{Vx} = \frac{Ri}{Rc + Rw + Ri} \quad (5)$$

Figure 11:
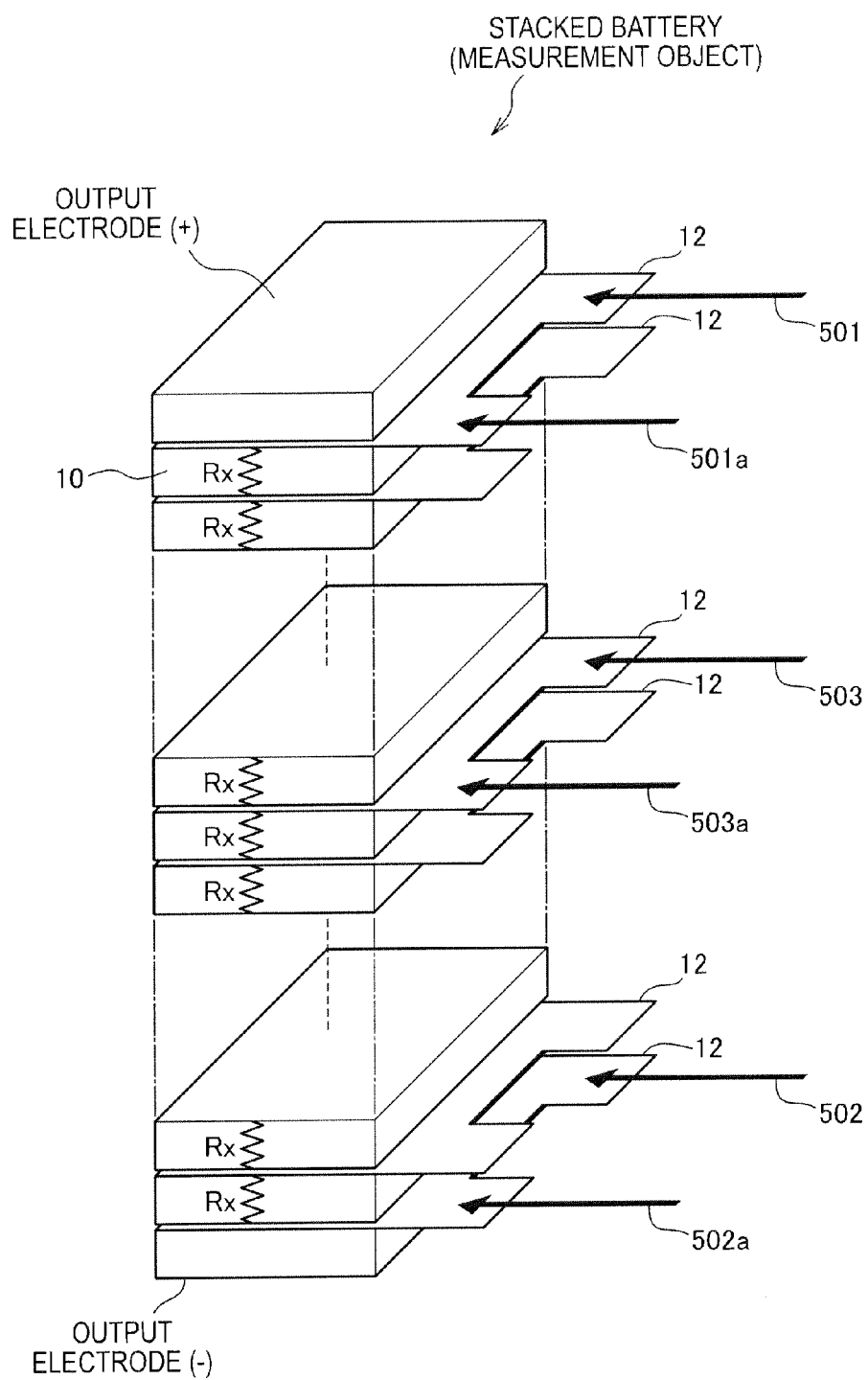
FIG. 11 shows a concrete structure of the second embodiment.

FIG. 11 shows a concrete structure of the second embodiment.

The separators (or bipolar plates) 12 of the power generation cells 10 to constitute the fuel-cell 1 are partially extended to provide connection portions.

Figure 12:
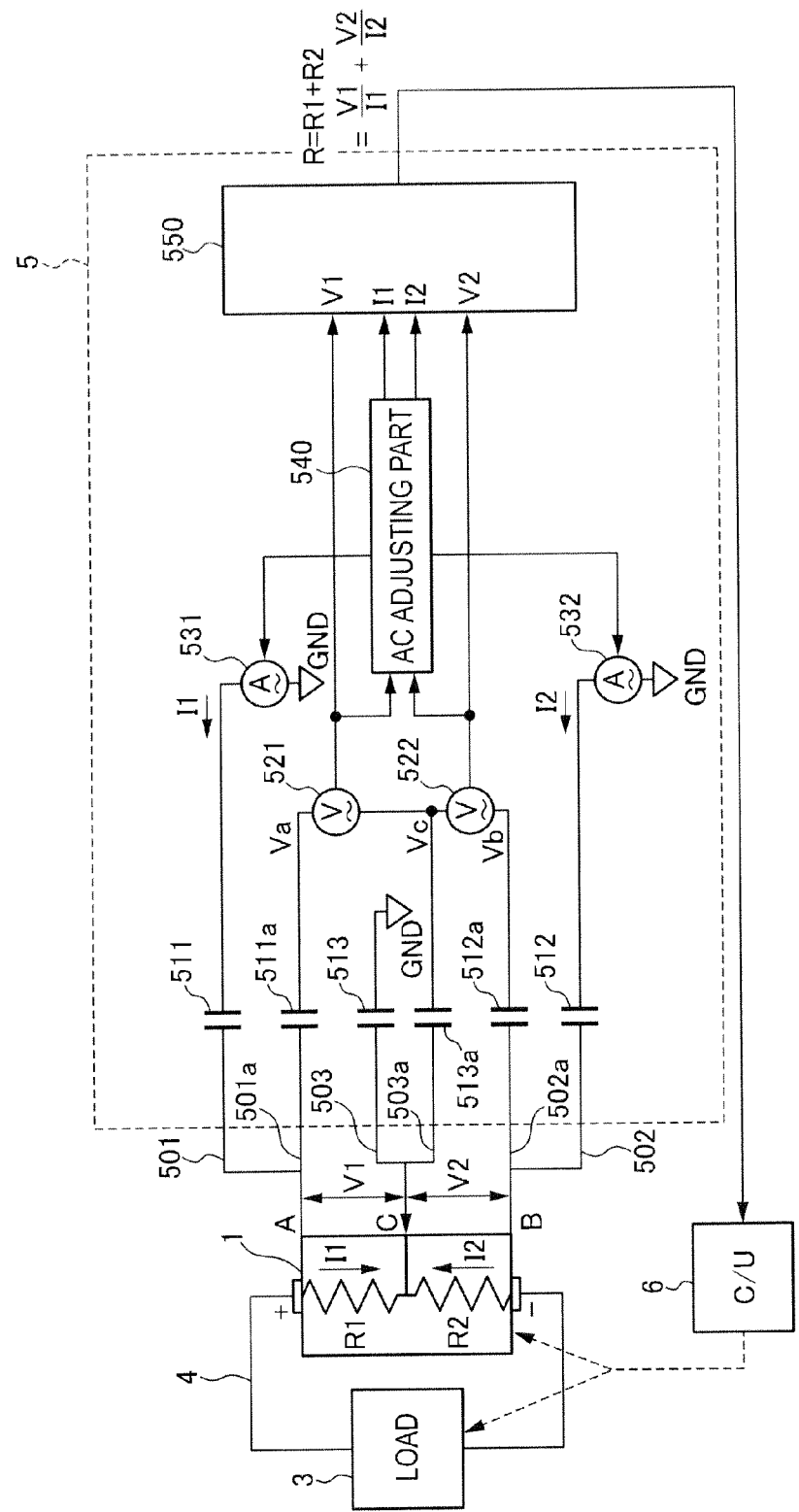
FIG. 12 is a circuit diagram showing the internal resistance measurement device for stacked battery according to the second embodiment of the present invention.

FIG. 12 is a circuit diagram showing the internal resistance measurement device for stacked battery according to the second embodiment of the present invention.

The positive electrode AC potential difference detecting part 521 is connected to a separator (or bipolar plate) on the positive electrode side of the fuel-cell 1 via a capacitor 511a. The positive electrode power supply part 531 is connected to, via the capacitor 511, the same separator (or bipolar plate) as the one connected to the positive AC potential difference detecting part 521 by a route 501 different from the route 501a used by the positive electrode AC potential difference detecting part 521.

The negative electrode AC potential difference detecting part 522 is connected to a separator (or bipolar plate) on the negative electrode side of the fuel-cell 1 via a capacitor 512a. The negative electrode power supply part 532 is connected to, via the capacitor 512, the same separator (or bipolar plate) as the one connected to the negative electrode AC potential difference detecting part 522 by a route 502 different from a route 502a used by the negative electrode AC potential difference detecting part 522.

A ground line 503 is connected to a separator (or bipolar plate) in the midpoint of the fuel-cell 1 via the capacitor 513. The positive electrode AC potential difference detecting part 521 and the negative electrode AC potential difference detecting part 522 are connected to, via a capacitor 513a, the same separator (or bipolar plate) as the one connected to the ground line 503 by a route 503a different from the ground line 503.

The present embodiment also focused attention on a proportional relationship between a command signal of the AC adjusting part 540 and output signals of the positive electrode power supply part 531 and the negative electrode power supply part 532, wherein the AC current values (I1, I2) are obtained based on the command signal.

According to the present embodiment, it is possible to substantially reduce effects of resistance fluctuations caused by the size of the wiring resistance and the contact resistance, the temperature and surface oxidization of the terminals or other factors. As a result, high versatility in designing signal wirings in relation to the stacked battery can be realized while enabling accurate detection of internal resistance in each cell of the stacked cell group at low costs.

The circuit can also be simplified because actual measurement of the AC current values (I1, I2) is not required.

Third Embodiment

Figure 13:
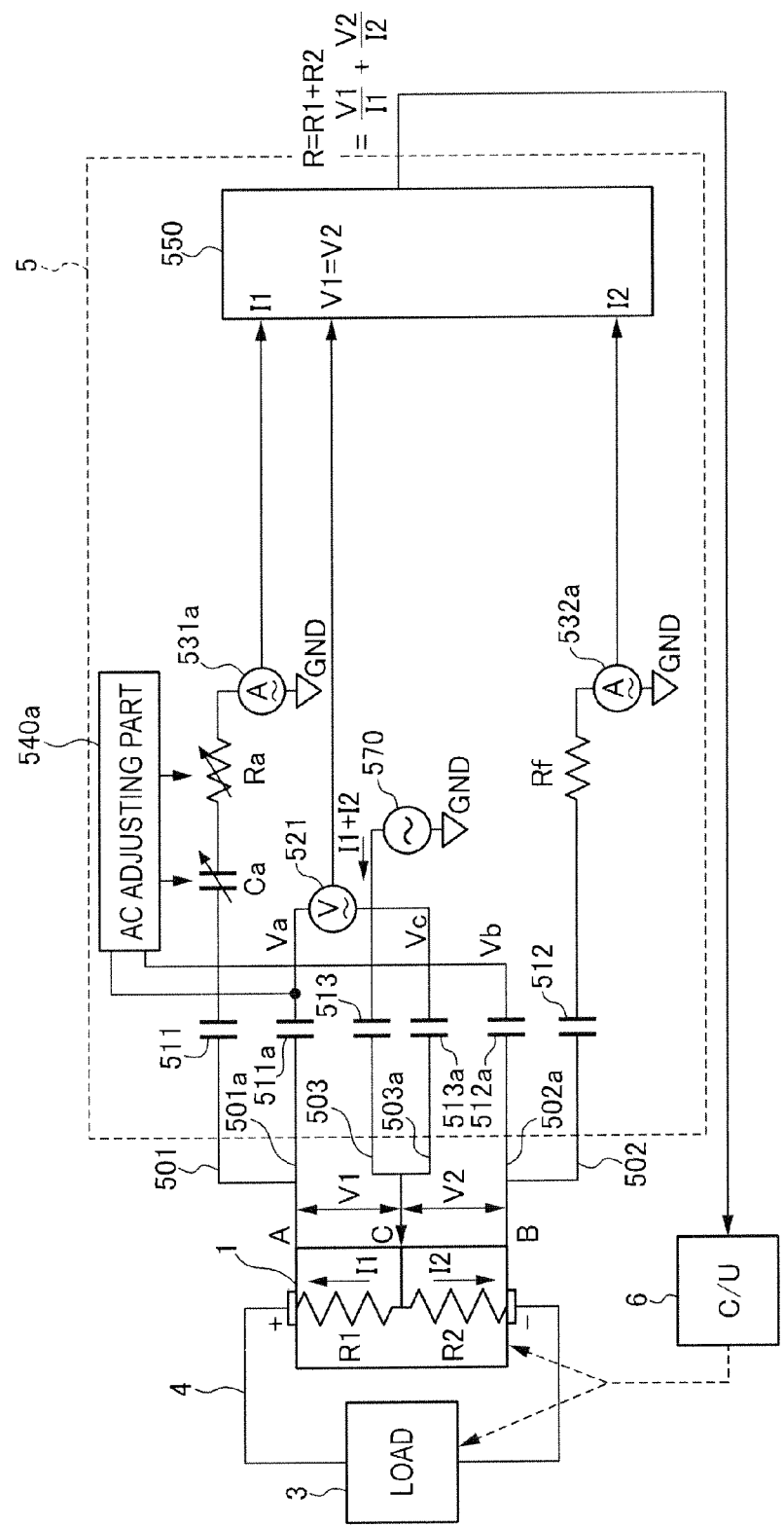
FIG. 13 is a circuit diagram showing an internal resistance measurement device for stacked battery according to a third embodiment of the present invention.

FIG. 13 is a circuit diagram showing an internal resistance measurement device for stacked battery according to a third embodiment of the present invention.

In the present embodiment, an AC power supply part 570 is connected to a separator (or bipolar plate) arranged in the midpoint of the fuel-cell 1 via the capacitor 513. The positive electrode AC potential difference detecting part 521 is also connected to, via the capacitor 513a, the same separator (or bipolar plate) as the one connected to the AC power supply part 570 by the route 503a different from the route 503 used by the AC power supply part 570.

A positive electrode AC current detecting part 531a is connected to, via a variable resistor Ra, a variable capacitor Ca and the capacitor 511, the same separator (or bipolar plate) as the one connected to the positive electrode AC potential difference detecting part 521 by the route 501 different from the route 501a used by the positive electrode AC potential difference detecting part 521.

A negative electrode AC current detecting part 532a is connected to, via a fixed resistor Rf and the capacitor 512, the same separator (or bipolar plate) as the one connected to the capacitor 512a by the route 502 which differs from the route 502a used by the capacitor 512a. Note that a current/voltage conversion circuit made of operational amplifier and an AC current sensor of the CT (current transformer) system or other devices can be used for the AC current detecting parts 531a and 532a.

An AC adjusting part 540a has one end connected between the capacitor 511a and the positive electrode AC potential difference detecting part 521. The other end of the AC adjusting part 540a is also connected to the capacitor 512a. Therefore, the AC adjusting part 540a can receive the positive electrode AC potential Va and the negative electrode AC potential Vb of the fuel-cell 1. Then, the AC adjusting part 540a adjusts the variable resistor Ra and the variable capacitor Ca.

Figure 14:
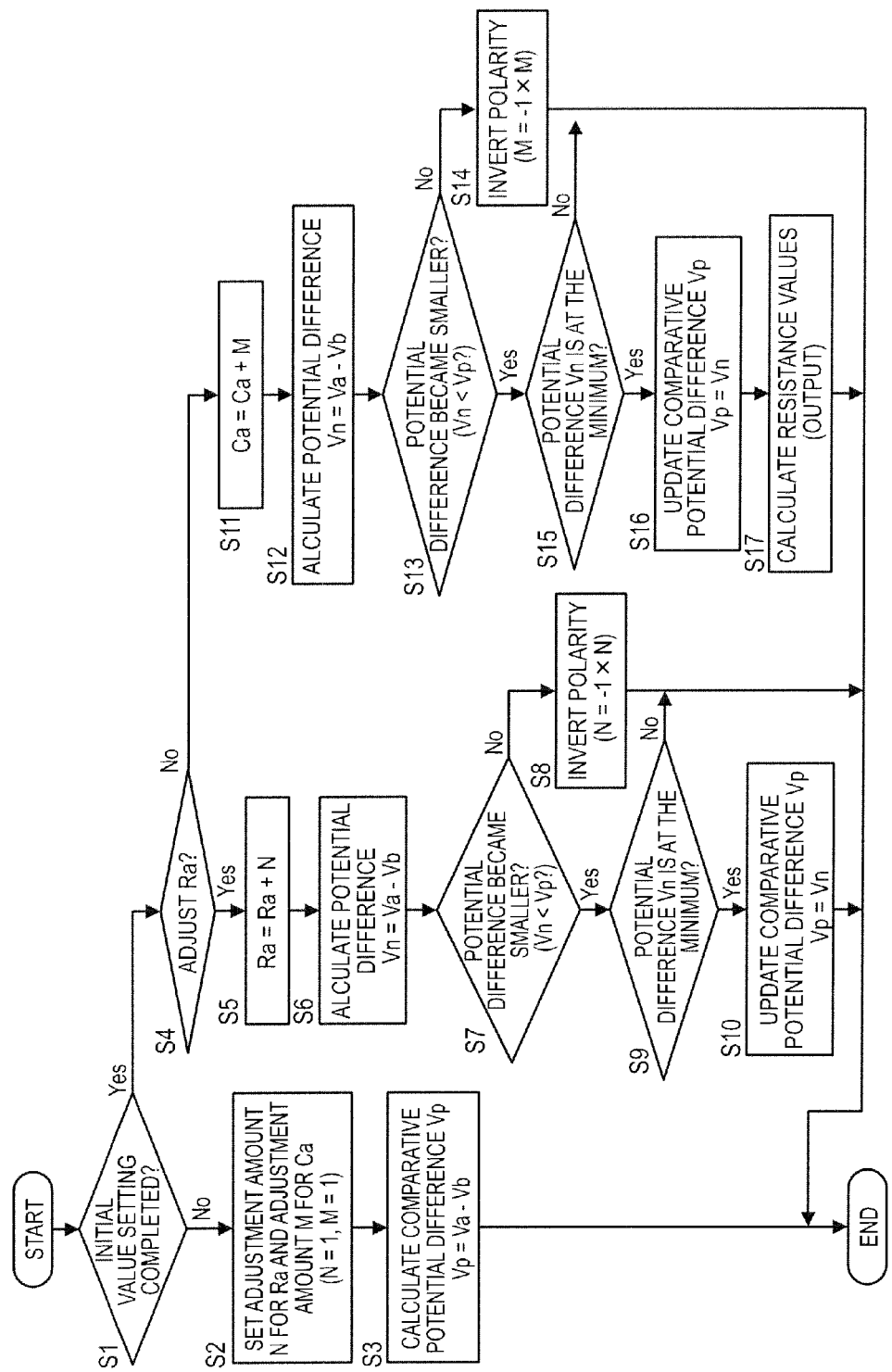
FIG. 14 is a control flowchart to be executed by a controller in the internal resistance measurement device for stacked battery according to the third embodiment of the present invention.

FIG. 14 is a control flowchart to be executed by the controller in the internal resistance measurement device for stacked battery according to the third embodiment of the present invention.

The controller determines in step S1 whether or not initial value setting is completed. The controller allows the process to move onto step S2 when the determination result is negative (i.e. initial value setting is not completed) or allows the process to move onto step S4 when the determination result is positive (i.e. initial value setting is completed)

In the step S2, the controller sets an adjustment amount N for the variable resistor Ra and an adjustment amount M for the variable capacitor Ca. Here, one is set for each of them as an example.

In step S3, the controller calculates a comparative potential difference Vp by subtracting the negative AC potential Vb from the positive AC potential Va.

In step S4, the controller determines whether or not the variable resistor Ra should be adjusted. The controller allows the process to move onto step S5 when the determination result is positive or allows the process to move onto step S11 when the determination result is negative.

In step S5, the controller adds the adjustment amount N to the resistance value Ra of the variable resistor in order to update the variable resistance value Ra.

In step S6, the controller calculates a potential difference Vn by subtracting the negative AC potential Vb from the positive AC potential Va.

In step S7, the controller determines whether or not the potential difference Vn became smaller than the comparative potential difference Vp. The controller allows the process to move onto step S8 when the determination result is negative or allows the process to move onto step S9 when the determination result is positive.

In step S8, the controller inverts the polarity of the adjustment amount N and once exits from process.

In step S9, the controller determines whether or not the potential difference Vn was set to the minimum. The controller allows the process to move onto step S10 when the determination result is positive or once exits from processing when the determination result is negative.

In step S10, the controller updates the comparative potential difference Vp by the potential difference Vn obtained at that point.

In step S11, the controller adds the adjustment amount M to the capacity Ca of the variable capacitor in order to update the variable capacitor capacity Ca.

In step S12, the controller calculates the potential difference Vn by subtracting the negative AC potential Vb from the positive AC potential Va.

In step S13, the controller determines whether or not the potential difference Vn became smaller than the comparative potential difference Vp. The controller allows the process to move onto step S14 when the determination result is negative or allows the process to move onto step S15 when the determination result is positive.

In step S14, the controller inverts the polarity of the adjustment amount M and once exits from the process.

In step S15, the controller determines whether or not the potential difference Vn is set to the minimum. The controller allows the process to move onto step S16 when the determination result is positive or once exits from processing when the determination result is negative.

In step S16, the controller updates the comparative potential difference Vp by the potential difference Vn obtained at that point.

In step S17, the controller calculates resistance values based on the aforementioned formulae (1-1) and (1-2).

Execution of the above flowchart is accompanied by the following operation.

Firstly, an initial value is set (S1→S2→S3).

In the next cycle, the variable resistor Ra is adjusted first. The variable resistance value Ra is adjusted (S4) to calculate the potential difference Vn (S5), followed by inverting the polarity of the adjustment amount N if the potential difference is not made smaller (S8) and determining whether or not the potential difference which was made smaller is a minimum value (S9). The same process (S1→S4→S5→S6→S7→S8 or S9) is repeated until the potential difference is a minimum value, whereby the variable resistance value Ra is adjusted to a minimum value. Then, when the variable resistance value Ra is adjusted to a minimum value, the comparative potential difference Vp is updated by the potential difference Vn obtained at that point (S10).

In the next cycle, the variable capacitor capacity Ca is adjusted. The variable capacitor capacity Ca is adjusted (S11) to calculate the potential difference Vn (S12), followed by inverting the polarity of the adjustment amount M if the potential difference is not made smaller (S14) and determining whether or not the potential difference which was made smaller is a minimum value (S15). The same process (S1→S4→S11→S12→S13→S14 or S15) is repeated until the potential difference is a minimum value, whereby the variable capacitor capacity Ca is adjusted to a minimum value. Then, when the variable capacitor capacity Ca is adjusted to a minimum value, the comparative potential difference Vp is updated by the potential difference Vn obtained at that point (S16).

Then, resistance values are calculated based on the aforementioned formulae (1-1) and (1-2) (S17).

Configuration as shown in the present embodiment necessarily provides the same AC voltage amplitude between both ends of each of the stacked cell groups. It is therefore possible to obtain the same effects as the first embodiment and the second embodiment. That is, the value of an AC current flowing through the internal resistance measurement object (i.e. fuel-cell) matches the value of AC currents outputted from the power supplies and therefore AC currents flowing through the measurement object can be detected accurately. Then, internal resistance in the stacked battery is obtained based on the AC currents, whereby accurate measurement of internal resistance of the stacked battery under operation can be realized without being affected by a condition of the load device.

Figure 15:
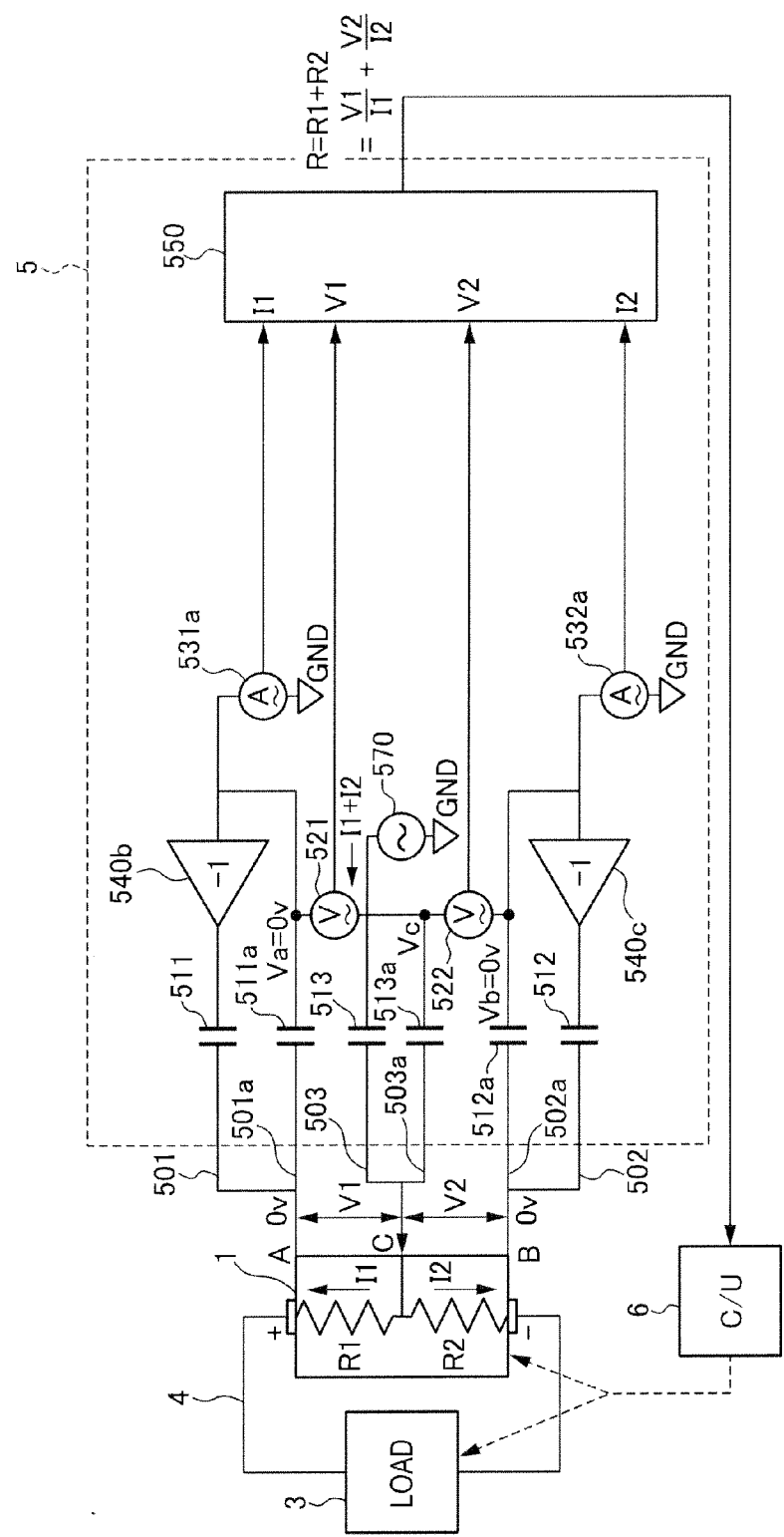
FIG. 15 is a circuit diagram showing an internal resistance measurement device for stacked battery according to a fourth embodiment of the present invention.

Furthermore, since both ends of each of the stacked cell groups necessarily have the same AC voltage amplitude according to the present embodiment, the AC potential difference detecting part may be arranged on either the positive electrode side or the negative electrode side. Note that the present embodiment is provided with the AC potential difference detecting part 521 on the positive electrode side. Accordingly, the circuit can be simplified Fourth Embodiment FIG. 15 is a circuit diagram showing an internal resistance measurement device for stacked battery according to a fourth embodiment of the present invention.

In the present embodiment, similar to the third embodiment, the AC power supply part 570 is connected to a separator (or bipolar plate) arranged in the midpoint of the fuel-cell 1 via the capacitor 513. The positive AC potential difference detecting part 521 and the negative electrode AC potential difference detecting part 522 are connected to, via the capacitor 513a, the same separator (or bipolar plate) as the one connected to the AC power supply part 570 by the route 503a different from the route 503 used by the AC power supply part 570.

A positive electrode polarity inverting amplifier 540b is connected to, via the capacitor 511, the same separator (or bipolar plate) as the one connected to the positive electrode AC potential difference detecting part 521 by the route 501 different from the route 501a used by the positive electrode AC potential difference detecting part 521.

A negative electrode polarity inverting amplifier 540c is connected to, via the capacitor 512, the same separator (or bipolar plate) as the one connected to the negative electrode AC potential difference detecting part 522 by the route 502 different from the route 502a used by the negative electrode AC potential difference detecting part 522. Note that circuits such as an inverting amplifier circuit made of operational amplifier, boot strap circuit and active noise cancel circuit are applicable to the polarity inverting amplifiers 540b and 540c.

Owing to such a configuration, the polarity of AC voltages detected at the output ends of the stacked battery is inverted and returned to the output terminals of the stacked battery, whereby the amplitude of AC voltages at the output ends of the stacked battery is forcibly eliminated (or turned zero). Therefore, the amplitude of both AC voltages at both ends of the stacked battery is turned zero and equipotentialized.

AC currents flowing through each of the stacked cell groups are detected by the AC current detecting parts 531a and 532a and AC voltages at both ends of the stacked cell group are detected by the AC potential difference detecting parts 521 and 522 connected to the AC voltage detecting lines.

Accordingly, the present embodiment makes it possible to simplify the circuit because a voltage comparing function realized by the AC adjusting part 540 is unnecessary.

Fifth Embodiment

Figure 16:
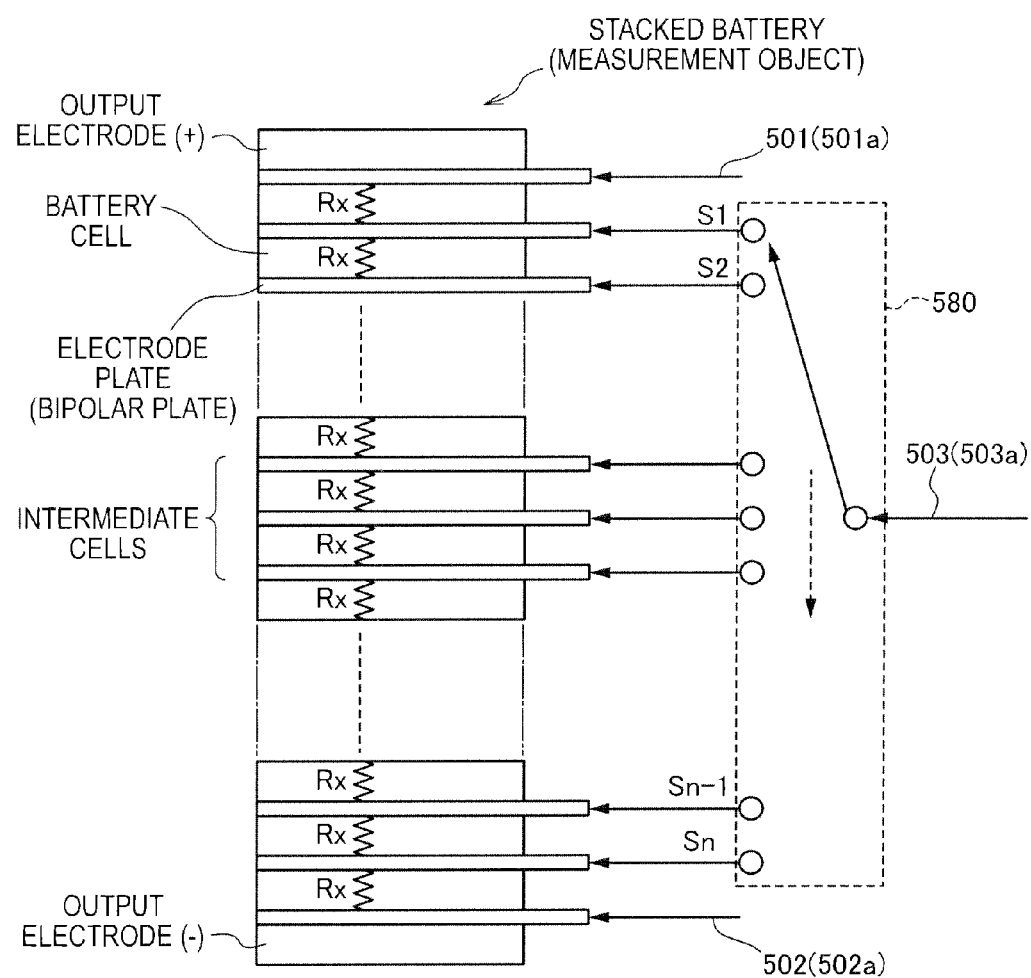
FIG. 16 shows an internal resistance measurement device for stacked battery according to a fifth embodiment of the present invention.

FIG. 16 shows an internal resistance measurement device for stacked battery according to a fifth embodiment of the present invention.

Each of the above embodiments involves connection of one midpoint. In contrast, the present embodiment switches the midpoint sequentially. That is, a connection switcher 580 is used to switch the midpoint sequentially Owing to such a configuration, resistance of a currently connected cell can be calculated by the comparison between a currently measured value and a previously measured value. Accordingly, internal resistance can be measured for each cell. It is therefore possible to monitor distribution of internal resistance in a stacking direction and local cell deterioration or the like.

Sixth Embodiment

Figure 17:
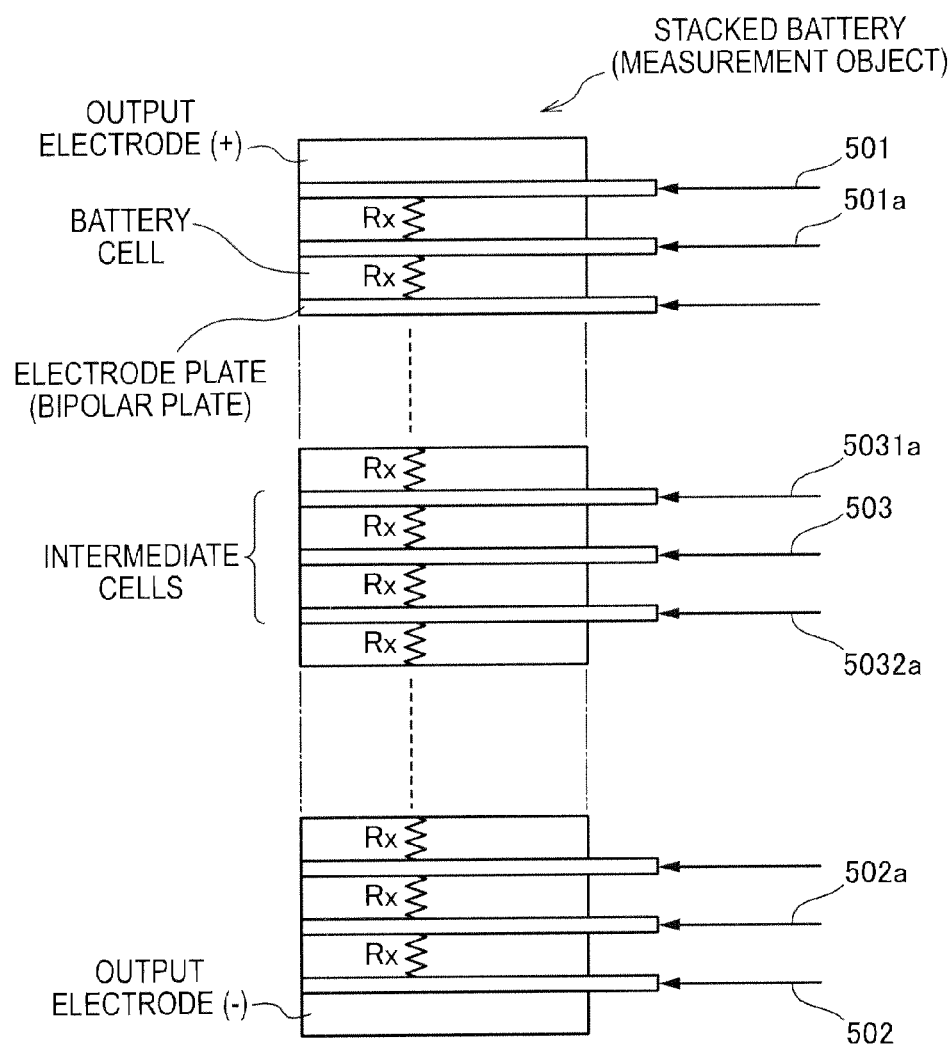
FIG. 17 shows an internal resistance measurement device for stacked battery according to a sixth embodiment of the present invention.

FIG. 17 shows an internal resistance measurement device for stacked battery according to a sixth embodiment of the present invention.

Figure 18:
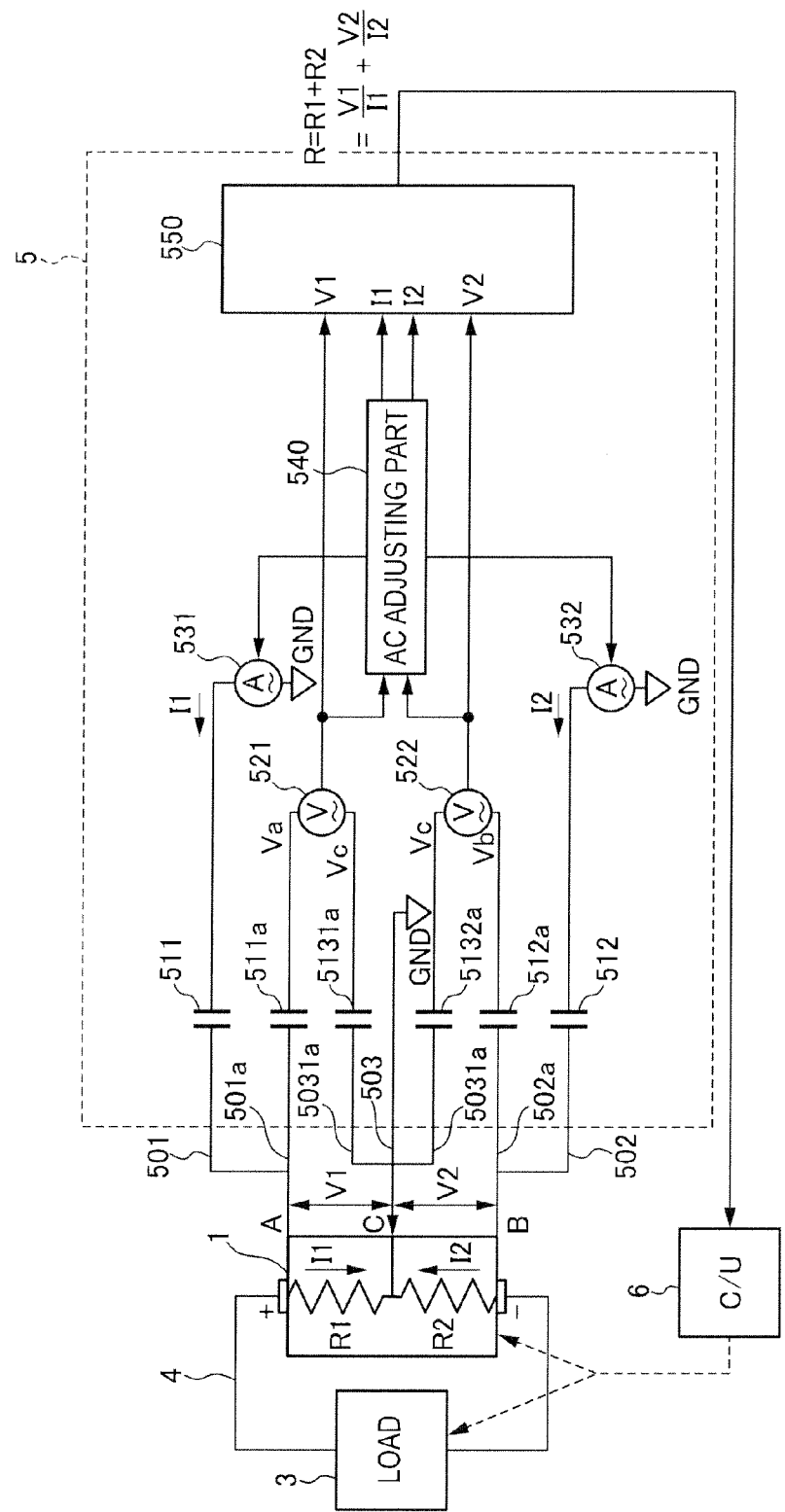
FIG. 18 is a concrete circuit diagram of the sixth embodiment.

In each of the above embodiments, each of the AC potential difference detecting parts and each of the power supply parts (or AC current detecting parts) are connected to the common separator (or bipolar plate). In contrast, the present embodiment involves connection of each of the components to a bipolar plate separated by at least another bipolar plate. Concrete circuit diagram is as shown in FIG. 18.

The positive electrode power supply part 531 is connected to the bipolar plate 501 on the positive electrode side of the fuel-cell 1 via the capacitor 511. The positive electrode AC potential difference detecting part 521 is connected to the bipolar plate 501a different from the bipolar plate 501 via the capacitor 511a. The positive electrode AC potential difference detecting part 521 is also connected to, via a capacitor 5131a, a bipolar plate 5031a different from the bipolar plate 503 which is connected to a ground line.

The negative electrode power supply part 532 is connected to the bipolar plate 502 on the negative electrode side of the fuel-cell 1 via the capacitor 512. The negative electrode AC potential difference detecting part 522 is connected to the bipolar plate 502a different from the bipolar plate 502 via the capacitor 512a. The negative electrode AC potential difference detecting part 522 is also connected to, via a capacitor 5132a, a bipolar plate 5032a different from the bipolar plate 503 connected to the ground line.

The same action effect as the second embodiment can also be obtained by the present embodiment. Miniaturization can be realized because a space occupied by the connection terminals can be made narrower. Note that it is impossible in the present embodiment to detect cell resistance between the bipolar plate 501 and the bipolar plate 501a, cell resistance between the bipolar plate 502 and the bipolar plate 502a, cell resistance between the bipolar plate 503 and the bipolar plate 5031a and cell resistance between the bipolar plate 503 and the bipolar plate 5032a because they are out of range of AC voltage detection. However, it is not problematic in such cases that the number of stacked cells is large as shown in large stacked batteries and/or resistance variations are aligned among cells, because average cell resistance per one cell can be obtained by using the number of cells in the detection range and amended.

Seventh Embodiment

Figure 19:
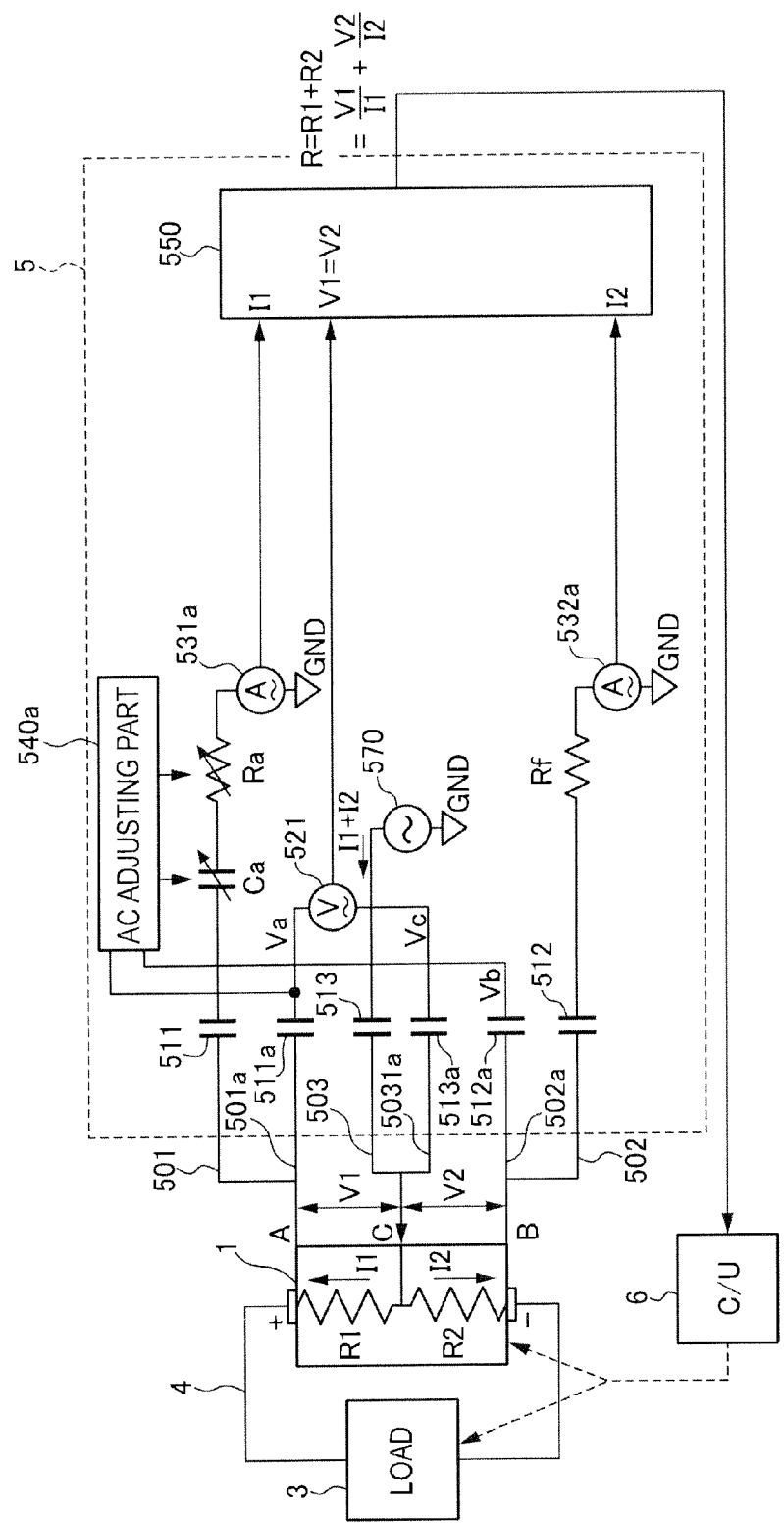
FIG. 19 is a circuit diagram showing an internal resistance measurement device for stacked battery according to a seventh embodiment of the present invention.

FIG. 19 is a circuit diagram showing an internal resistance measurement device for stacked battery according to a seventh embodiment of the present invention.

The present embodiment is the same as the third embodiment (shown in FIG. 13) in terms of the circuit diagram. However, as opposed to the third embodiment in which the AC potential difference detecting part and the power supply part (or AC current detecting part) are connected to the common separator (or bipolar plate), the present embodiment involves connecting them to different bipolar plates separated by at least another bipolar plate. Note that the AC potential difference detecting part is arranged only on the positive electrode side in the present embodiment and the positive electrode AC potential difference detecting part is connected to the bipolar plate 5031a as shown in FIG. 17. It is unnecessary to prepare an AC potential difference detecting part connected to the bipolar plate 5032a shown in FIG. 17.

Owing to such a configuration, similar to the third embodiment, the AC voltage amplitude necessarily remains the same at both ends of each of the stacked cell groups. Therefore, the value of AC currents flowing through the internal resistance measurement object (or fuel-cell) matches the value of AC currents outputted from the power supplies and therefore AC currents flowing through the measurement object can be detected accurately. Then, internal resistance of the stacked battery is obtained based on the AC currents, whereby realizing accurate measurement of internal resistance of the stacked battery under operation without being affected by a condition of the load device. It is also possible to achieve miniaturization because a space occupied by the connection terminals can be made narrower.

Eighth Embodiment

Figure 20:
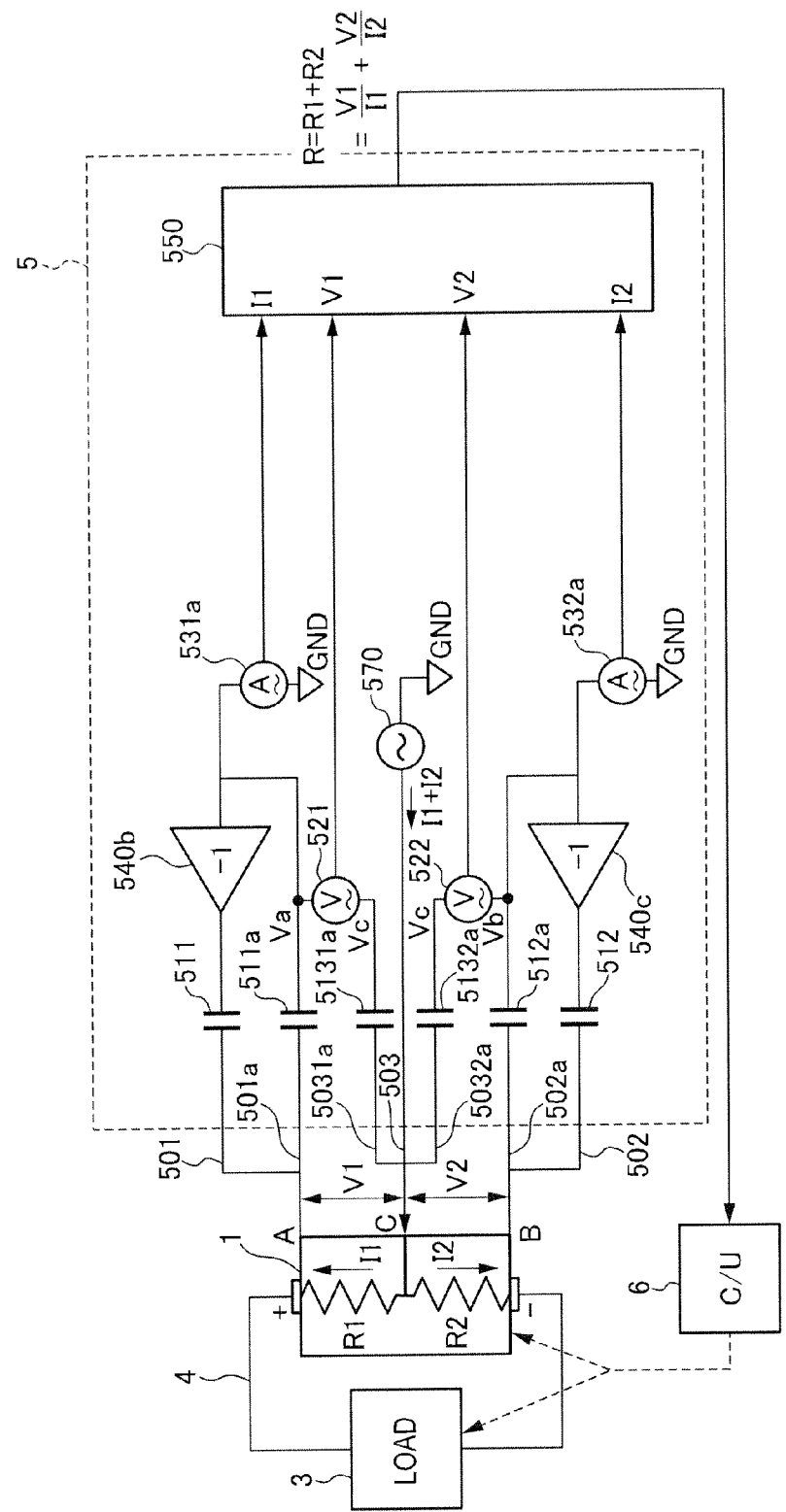
FIG. 20 is a circuit diagram showing an internal resistance measurement device for stacked battery according to an eighth embodiment of the present invention.

FIG. 20 is a circuit diagram showing an internal resistance measurement device for stacked battery according to an eighth embodiment of the present invention.

The present embodiment is basically the same as the fourth embodiment (shown in FIG. 15). However, as opposed to the fourth embodiment (shown in FIG. 15) in which each of the AC potential difference detecting parts and each of the power supply parts (or AC current detecting parts) are connected to the common separator (or bipolar plate), the present embodiment involves connecting them to different bipolar plates separated by at least another bipolar plate. A concrete circuit diagram is as shown in FIG. 20.

The positive electrode polarity inverting amplifier 540b is connected to the bipolar plate 501 on the positive electrode side of the fuel-cell 1 via the capacitor 511. The positive electrode AC potential difference detecting part 521 is connected to the bipolar plate 501a which differs from the bipolar plate 501 via the capacitor 511a. The positive electrode AC potential difference detecting part 521 is also connected to, via the capacitor 5131a, the bipolar plate 5031a which differs from the bipolar plate 503 connected to the ground line.

The negative electrode polarity inverting amplifier 540c is connected to the bipolar plate 502 on the negative electrode side of the fuel-cell 1 via the capacitor 512. The negative electrode AC potential difference detecting part 522 is connected to the bipolar plate 502a which differs from the bipolar plate 502 via the capacitor 512a. The negative electrode AC potential difference detecting part 522 is also connected to, via the capacitor 5132a, the bipolar plate 5032a which differs from the bipolar plate 503 connected to the ground line.

Owing to such a configuration, similar to the fourth embodiment, the polarity of AC currents detected at output ends of the stacked battery is inverted and returned to the output terminals of the stacked battery, whereby the amplitude of AC voltages at output ends of the stacked battery is forcibly eliminated (or turned zero). Therefore, the amplitude of both AC voltages at both ends of the stacked battery is turned zero and equipotentialized. In addition, AC currents flowing through each of the stacked cell groups are detected by the AC current detecting parts 531a and 532a and AC voltages at both ends of the stacked cell group are detected by the AC potential difference detecting part 521 and 522 connected to the AC voltage detecting lines. As a result, the present embodiment makes it possible to simplify the circuit because a voltage comparing function realized by the AC adjusting part 540 is not necessary. Miniaturization can also be achieved because a space occupied by the connection terminals can be made narrower.

Although the embodiments of the present invention are as explained above, the above embodiments exhibit merely a part of application examples of the present invention and are not intended to limit the technical scope of the present invention to concrete configurations of the above embodiments.

Figure 21A:
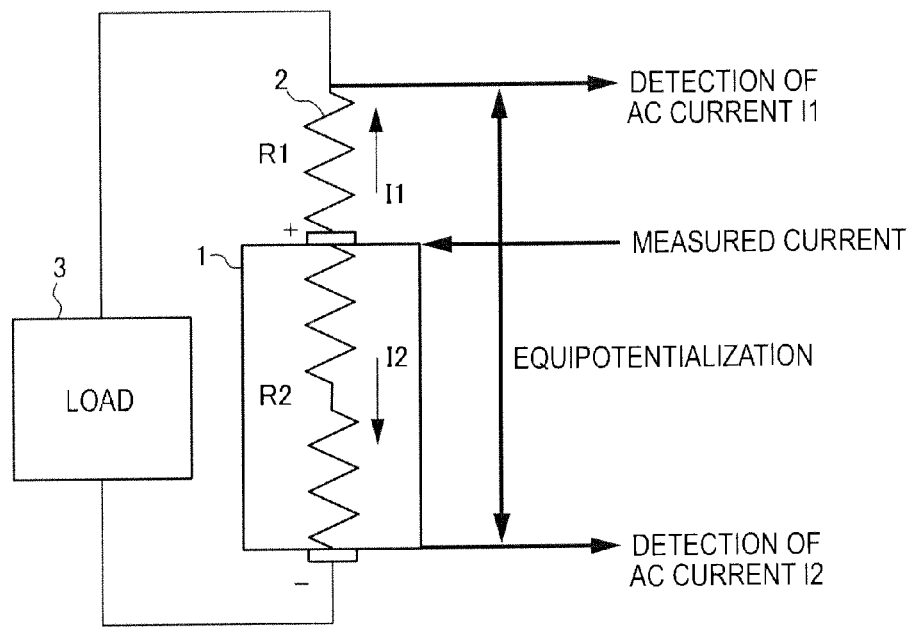
FIG. 21A shows a first modified embodiment.
Figure 21B:
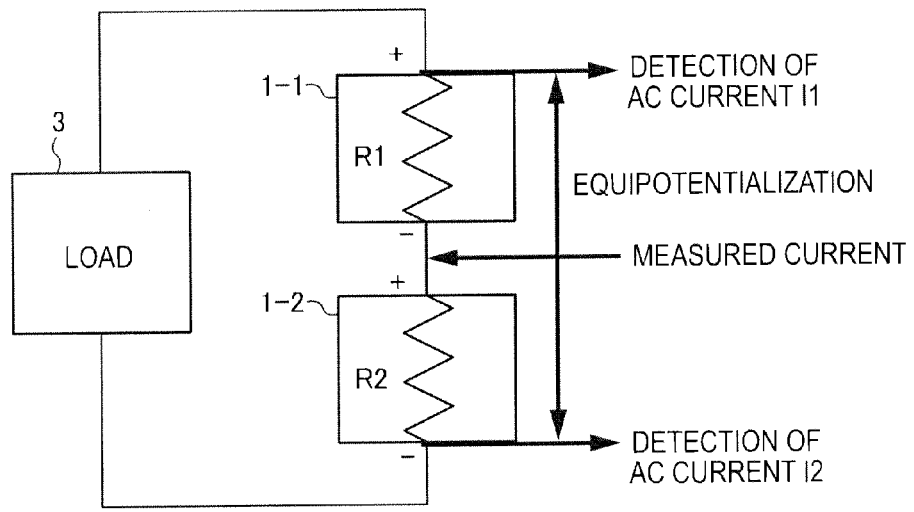
FIG. 21B shows a second modified embodiment.

For example, as shown in FIG. 21A, the internal resistance measurement object may further contain a resistor 2 connected in series to the stacked battery 1. In such a case, an end of the resistor 2 shown in FIG. 21A is regarded as the positive electrode in the above embodiments, the positive electrode of the stacked battery 1 shown in FIG. 21A is regarded as the midpoint in the above embodiments, and the negative electrode of the stacked battery 1 shown in FIG. 21A is regarded as the negative electrode in the above embodiments. By thus recognizing each of the electrodes, a whole internal resistance value of the stacked battery as shown in FIG. 21A can be obtained as R2. Even in such a configuration, it is possible to achieve accurate measurement of a whole internal resistance value in the stacked battery Moreover, the internal resistance measurement object may also be configured in such that a stacked battery 1-2 is further connected in series to a stacked battery 1-1. In such a case, a positive electrode of the stacked battery 1-1 is regarded as the positive electrode in the above embodiments, a midpoint between the stacked battery 1-1 and the stacked battery 1-2 is regarded as the midpoint in the above embodiments, and a negative electrode of the stacked battery 1-2 is regarded as the negative electrode in the above embodiments. By thus recognizing each of the electrodes, an internal resistance value of the stacked battery 1-1 is obtained as R1 and an internal resistance value of the stacked battery 1-2 is obtained as R2. Even in such a configuration, it is possible to achieve accurate measurement of internal resistance values in the stacked battery 1-1 and the stacked battery 1-2.

Furthermore, the fuel-cell used as an example of the stacked battery in the above embodiment may also be replaced with other batteries such as lithium ion battery. That is, the present invention is applicable to any batteries as long as a plurality of power generating elements is stacked. Measurement of internal resistance realized in such batteries enables efficient operation, which is desirable.

In addition, even in the configuration as shown in FIG. 17, the midpoint may be switched sequentially as shown in the fifth embodiment. Even in such a configuration, the same action effect as the fifth embodiment can be obtained.

The above embodiments can also be combined with each other as appropriate.

The present application claims priority to Japanese Patent Application No. 2010-275638 filed in Japan Patent Office on Dec. 10, 2010. The contents of this application are incorporated herein by reference in their entirety.

The invention claimed is:

1. An internal resistance measurement device for stacked battery comprising:
    an AC power supply part for outputting an AC current to an internal resistance measurement object comprising a stacked battery made of a plurality of stacked power generating elements by being connected to the internal resistance measurement object;
    a positive portion connected to a positive electrode of the internal resistance measurement object;
    a negative portion connected to a negative electrode of the internal resistance measurement object;
    a middle portion connected to a middle part of the internal resistance measurement object;
    an AC adjusting part for adjusting an AC current output to the positive electrode and the negative electrode of the internal resistance measurement object; and
    a resistance calculating part for calculating resistance of the stacked battery based on the adjusted AC current and the AC potential difference.

2. An internal resistance measurement device for stacked battery comprising:
    an AC power supply part for outputting an AC current to an internal resistance measurement object comprising a stacked battery made of a plurality of stacked power generating elements by being connected to the internal resistance measurement object;
    an AC adjusting part for adjusting an AC current so that a positive electrode AC potential difference, being a potential difference obtained by subtracting potential in a middle portion from potential in a portion connected to a load device on the positive electrode side of the internal resistance measurement object, matches a negative electrode AC potential difference, being a potential difference obtained by subtracting potential in the middle portion from potential in a portion connected to the load device on the negative electrode side of the internal resistance measurement object; and
    a resistance calculating part for calculating resistance of the stacked battery based on the adjusted AC current and the AC potential difference.

3. An internal resistance measurement device for stacked battery comprising:
    an AC power supply part for outputting an AC current to an internal resistance measurement object including at least a stacked battery made of a plurality of stacked power generating elements by being connected to the internal resistance measurement object;
    an AC adjusting part for adjusting an AC current so that a positive electrode AC potential difference, being a potential difference obtained by subtracting potential in a middle portion from potential in a portion connected to a load device on the positive electrode side of the internal resistance measurement object, matches a negative electrode AC potential difference, being a potential difference obtained by subtracting potential in the middle portion from potential in a portion connected to the load device on the negative electrode side of the internal resistance measurement object; and
    a resistance calculating part for calculating resistance of the stacked battery based on the adjusted AC current and the AC potential difference.

4. The internal resistance measurement device for stacked battery according to claim 3, wherein:
    the internal resistance measurement object is the stacked battery; and
    the AC adjusting part adjusts an AC current so that a positive electrode AC potential difference, being a potential difference obtained by subtracting potential in a middle portion from potential in a portion connected to a load device on the positive electrode side of the stacked battery, matches a negative electrode AC potential difference, being a potential difference obtained by subtracting potential in the middle portion from potential in a portion connected to the load device on the negative electrode side of the stacked battery.

5. The internal resistance measurement device for stacked battery according to claim 3, wherein;
    the AC power supply part includes a positive electrode power supply part for outputting an AC current to the internal resistance measurement object by being connected to a positive electrode connection part of the internal resistance measurement object via a DC interrupting part, and a negative electrode power supply part for outputting an AC current to the internal resistance measurement object by being connected to a negative electrode connection part of the internal resistance measurement object via a DC interrupting part; and
    the AC adjusting part adjusts the positive electrode power supply part and the negative electrode power supply part so that the positive electrode AC potential difference matches the negative electrode AC potential difference.

6. The internal resistance measurement device for stacked battery according to claim 5, wherein:
    the positive electrode connection part is connected to, via a DC interrupting part, a positive electrode AC potential difference detector for detecting the positive electrode AC potential difference by a route different from a route connected to the positive electrode power supply part;

the negative electrode connection part is connected to, via a DC interrupting part, a negative electrode AC potential difference detector for detecting the negative electrode AC potential difference by a route different from a route connected to the negative electrode power supply part; and the middle part is connected to a ground line via a DC interrupting part and connected to, via a DC interrupting part, the positive electrode AC potential difference detector and the negative electrode AC potential difference detector by a route different from the route connected to the ground line.

7. The internal resistance measurement device for stacked battery according to claim 5, wherein:

a positive electrode AC potential difference detector for detecting the positive electrode AC potential difference is connected to, via a DC interrupting part, a portion separated from the positive electrode connection part by at least one power generating element;

a negative electrode AC potential difference detector for detecting the negative electrode AC potential difference is connected to, via a DC interrupting part, a portion separated from the negative electrode connection part by at least one power generating element;

the middle portion is connected to a ground line via a DC interrupting part;

a portion on the positive electrode side to be separated from the middle portion by at least one power generating element is connected to the positive electrode AC potential difference detector via a DC interrupting part; and a portion on the negative electrode side to be separated from the middle portion by at least one power generating element is connected to the negative electrode AC potential difference detector via a DC interrupting part.

8. The internal resistance measurement device for stacked battery according to claim 3, comprising:

a variable resistor and a variable capacitor connected to one of a positive electrode connection part and a negative electrode connection part of the internal resistance measurement object via a DC interrupting part;

a fixed resistor connected to the other one of the positive electrode connection part and the negative electrode connection part of the internal resistance measurement object via a DC interrupting part; and an AC potential difference detector for detecting the positive electrode AC potential difference or the negative electrode AC potential difference by being connected to one of the positive electrode connection part and the negative electrode connection part and the middle portion via a DC interrupting part, wherein:

the AC power supply part outputs an AC current to the middle portion by being connected to the middle portion via a DC interrupting part; and the AC adjusting part adjusts the variable resistor and the variable capacitor so that the positive electrode AC potential matches the negative electrode AC potential.

9. The internal resistance measurement device for stacked battery according to claim 8, wherein:

the positive electrode connection part is connected to, via a DC interrupting part, a route different from a route connected to one of the variable resistor and the fixed resistor so as to output the positive electrode AC potential to the AC adjusting part;

the negative electrode connection part is connected to, via a DC interrupting part, a route different from a route connected to the other one of the variable resistor and the fixed resistor so as to output the negative electrode AC potential to the AC adjusting part; and the middle portion is connected to, via a DC interrupting part, the AC potential difference detector by a route different from a route connected to the AC power supply part.

10. The internal resistance measurement device for stacked battery according to claim 8, wherein:

a portion separated from the positive electrode connection part by at least one power generating element is connected to, via a DC interrupting part, a route for outputting the positive electrode AC potential to the AC adjusting part;

a portion separated from the negative electrode connection part by at least one power generating element is connected to, via a DC interrupting part, a route for outputting the negative electrode AC potential to the AC adjusting part; and a portion separated from the middle portion by at least one power generating element is connected to the AC potential difference detector via a DC interrupting part.

11. The internal resistance measurement device for stacked battery according to claim 3, wherein:

the AC power supply part outputs an AC current to the middle portion by being connected to the middle portion via a DC interrupting part; and the AC adjusting part includes a positive electrode adjusting part for turning potential in a positive electrode connection part of the internal resistance measurement object to zero by being connected to the positive electrode connection part of the internal resistance measurement object via a DC interrupting part, and a negative electrode adjusting part for turning potential in a negative electrode connection part of the internal resistance measurement object to zero by being connected to the negative electrode connection part of the internal resistance measurement object via a DC interrupting part.

12. The internal resistance measurement device for stacked battery according to claim 11, wherein:

the positive electrode connection part is connected to, via a DC interrupting part, a positive electrode AC potential difference detector for detecting the positive electrode AC potential difference, by a route different from a route connected to the positive electrode adjusting part;

the negative electrode connection part is connected to, via a DC interrupting part, a negative electrode AC potential difference detector for detecting the negative electrode AC potential difference, by a route different from a route connected to the negative electrode adjusting part; and the middle portion is connected to, via a DC interrupting part, the positive electrode AC potential difference detector and the negative electrode AC potential difference detector by a route different from a route connected to the AC power supply part.

13. The internal resistance measurement device for stacked battery according to claim 11, wherein:

a portion separated from the positive electrode connection part by at least one power generating element is connected to, via a DC interrupting part, a positive electrode AC potential difference detector for detecting the positive electrode AC potential difference;

a portion separated from the negative electrode connection part by at least one power generating element is connected to, via a DC interrupting part, a negative electrode AC potential difference detector for detecting the negative electrode AC potential difference;

a portion on the positive electrode side to be separated from the middle portion by at least one power generating element is connected to the positive electrode AC potential difference detector via a DC interrupting part; and a portion on the negative electrode side to be separated from the middle portion by at least one power generating element is connected to, via a DC interrupting part, the negative electrode AC potential difference detector.

14. The internal resistance measurement device for stacked battery according to claim 3, further comprising:
a connection switch changer for switching the middle portion sequentially.

15. An internal resistance measurement method for stacked battery comprising:
an AC output step of outputting an AC current to an internal resistance measurement object comprising a stacked battery made of a plurality of stacked power generating elements by being connected to the internal resistance measurement object;

an AC adjusting step of adjusting an AC current so that a positive electrode AC potential difference, being a potential difference obtained by subtracting potential in a middle portion from potential in a portion connected to a load device on the positive electrode side of the internal resistance measurement object, matches a negative electrode AC potential difference, being a potential difference obtained by subtracting potential in the middle portion from potential in a portion connected to the load device on the negative electrode side of the internal resistance measurement object; and a resistance calculating step of calculating resistance of the stacked battery based on the adjusted AC current and the AC potential difference.

16. An internal resistance measurement method for stacked battery by outputting an AC power supply part for outputting an AC current to an internal resistance measurement object including at least a stacked battery made of a plurality of stacked power generating elements, comprising:
providing a middle electrode for providing a common AC voltage of a positive electrode and a negative electrode at a middle portion between the positive electrode side and the negative electrode side of the internal resistance measurement object;

supplying an AC current to the positive electrode side and the negative electrode side of the internal resistance measurement object;

adjusting an AC current so that a positive electrode AC potential difference, being a potential difference obtained by subtracting potential in the middle electrode from potential on the positive electrode of the internal resistance measurement object, matches a negative electrode AC potential difference, being a potential difference obtained by subtracting potential in the middle electrode from potential on the negative electrode of the internal resistance measurement object; and calculating resistance of the stacked battery based on the adjusted AC current and the AC potential difference.

* * * * *